(12) United States Patent
Matsui

(10) Patent No.: US 8,530,311 B2
(45) Date of Patent: Sep. 10, 2013

(54) METHOD OF MANUFACTURING SEMICONDUCTOR DEVICE

(75) Inventor: Takayuki Matsui, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/471,798

(22) Filed: May 15, 2012

(65) Prior Publication Data
US 2012/0302050 A1 Nov. 29, 2012

(30) Foreign Application Priority Data

May 27, 2011 (JP) .................................. 2011-118976

(51) Int. Cl.
*H01L 21/336* (2006.01)

(52) U.S. Cl.
USPC ............................ 438/268; 438/270; 438/282

(58) Field of Classification Search
USPC .......................................... 438/268, 270, 282
See application file for complete search history.

(56) References Cited

U.S. PATENT DOCUMENTS

| 6,077,745 | A  | * | 6/2000 | Burns et al. ................... 438/270 |
| 6,175,128 | B1 | * | 1/2001 | Hakey et al. .................. 257/296 |
| 6,426,526 | B1 | * | 7/2002 | Divakaruni et al. .......... 257/302 |
| 7,803,697 | B2 | * | 9/2010 | Kim et al. ..................... 438/478 |

FOREIGN PATENT DOCUMENTS

JP         2008-311641         12/2008

* cited by examiner

*Primary Examiner* — Luan C Thai
(74) *Attorney, Agent, or Firm* — Young & Thompson

(57) ABSTRACT

Disclosed herein is a method of manufacturing a semiconductor device. The method comprises forming a first silicon film on a semiconductor substrate, forming a second silicon film on the first silicon film, forming a third silicon film on the second silicon film, and forming a first diffusion barrier film on the third silicon film. The method further comprises performing a thermal treatment to diffuse an impurity included in the second silicon film into at least the first silicon film and the semiconductor substrate, respectively.

18 Claims, 39 Drawing Sheets

METHOD OF MANUFACTURING SEMICONDUCTOR DEVICE

This application is based upon and claims the benefit of priority from Japanese patent application No. 2011-118976, filed on May 27, 2011, the disclosure of which is incorporated herein in its entirety by reference.

BACKGROUND OF THE INVENTION

1. Field of the Invention

The present invention relates to a method of manufacturing a semiconductor device.

2. Description of Related Art

An increase of the density of a metal oxide semiconductor field effect transistor (MOSFET) is making it difficult to arrange a gate, a source, and a drain as components of a MOSFET on a plane. A three-dimensional layout has been required in a dynamic random access memory (DRAM) having a minimum wiring pitch of 90 nm or less. Such a three-dimensional layout refers to a structure in which a source and a drain (S/D) are formed at an upper end and a lower end of a pillar of a semiconductor extending in a direction perpendicular to a principal plane of a semiconductor substrate (in a normal direction to a principal plane of a semiconductor substrate), a gate insulator film and a gate electrode (word line) are arranged on a surface of an intermediate portion of the pillar, and those components are stacked on the principal plane of the semiconductor substrate. In the following description, a transistor having such a structure is referred to as a vertical transistor. A pillar of a semiconductor as described above is referred to as a semiconductor pillar. In a case where a semiconductor is silicon, a pillar of a semiconductor is referred to as a silicon pillar. An example of a vertical transistor is disclosed in JP-A 2008-311641 (Patent Document 1).

SUMMARY

FIG. 1 is a perspective view schematically showing vertical transistors forming memory cells of a DRAM. The X-direction, Y-direction, and Z-direction are indicated in the drawings as needed to provide an explanation using three directions of the X-direction, Y-direction, and Z-direction in the following description. Trenches 143a, 143b, 143c, and 143d are formed in a semiconductor substrate 100 of silicon (hereinafter referred to as a silicon substrate 100). Those trenches 143a, 143b, 143c, and 143d extend along the Y-direction. In the following description, those four trenches may collectively be referred to as trenches 143. Silicon pillars 101a, 101b, 102a, and 102b are formed in an area between the trenches 143a and 143b and in an area between the trenches 143b and 143c. Those silicon pillars 101a, 101b, 102a, and 102b extend along the Z-direction, which is a normal direction to a surface of the silicon substrate 100 (protrude vertical to a surface of the silicon substrate), and serve as channels of transistors. Similarly, a silicon pillar 101c is located between the trench 143c and another trench (not shown). In the following description, the silicon pillars 101a, 101b, and 101c may collectively be referred to as silicon pillars 101, and the silicon pillar 102a and 102b may collectively be referred to as silicon pillars 102. A pair of buried gate electrodes 108a and 108b are formed on both sides of the silicon pillar 101a so as to extend along the X-direction. A pair of buried gate electrodes 108c and 108d are formed on both sides of the adjacent silicon pillar 102a so as to extend along the X-direction. In the following description, those four gate electrodes may collectively be referred to as gate electrodes 108. The gate electrodes 108 serve as word lines.

Diffusion layers 146a, 146b, 146c, 146d, 146e, 146f, and 146g are formed within the silicon pillars. In the following description, the six diffusion layers except the dummy diffusion layer 146a may collectively be referred to as diffusion layers 146. The diffusion layers 146 serve as bit lines. The trenches 143a, 143b, 143c, and 143d are filled with insulator films 144a, 144b, 144c, and 144d, respectively, for insulating the diffusion layers 146a to 146g opposed on both sides of each of the trenches. In the following description, the four insulator films may collectively be referred to as insulator films 144. Particularly, the insulator film 144d, which is filled in the trench 143d surrounding the silicon pillars, forms a shallow trench isolation (STI) 145 to terminate ends of the trenches 143a, 143b, and 143c and isolate the trenches 143a, 143b, and 143c from each other.

In a plan view, the diffusion layers 146, which serve as bit lines, extend in a direction (Y-direction) perpendicular to a direction (X-direction) in which the word lines extend. The diffusion layers 146 provided in the silicon substrate 100 serve as one of a source and a drain (S/D) of a transistor. Diffusion layers (not shown) serving as another one of a source and a drain (S/D) of the transistor are formed at an upper portion of each of the silicon pillars 101 and 102. Capacitors 113 are provided on each of the silicon pillars 101 and 102. With regard to the silicon pillar 101a, one vertical transistor is formed by the diffusion layers 146b and 146c, which are formed within the silicon pillar 101a so as to serve as one of a source and a drain (S/D) of the transistor, a pair of gate electrodes 108a and 108b provided on both sides of the silicon pillar 101a, and the diffusion layers formed at an upper portion of the silicon pillar 101a so as to serve as another one of a source and a drain (S/D) of the transistor.

With such a vertical transistor, an area required for a unit memory cell can be reduced. Therefore, the density of a MOSFET can be increased. Since a vertical transistor has a layered structure in which a bit line is located below a gate electrode, the diffusion layers to be bit lines are formed within a semiconductor pillar near the bottom of the semiconductor pillar. Furthermore, an opening area of a trench to be filled with an insulator film should be reduced in order to reduce an area required for a MOSFET. Therefore, an aspect ratio (depth/opening area) of a trench tends to increase. Accordingly, an ion implantation method from above a trench cannot be used to form diffusion layers to be bit lines. This is because a silicon pillar in which diffusion layers are to be formed is located right below a silicon pillar to be a channel. With an ion implantation method, unnecessary ions would be implanted into the silicon pillar to be a channel because of variations in shape of trenches. Those unnecessary ions implanted induce subsequent malfunction of the transistor, thereby inhibiting use of an ion implantation method.

The present invention seeks to solve one or more of the above problems, or to improve upon those problems at least in part.

In one embodiment, there is provided a first method of manufacturing a semiconductor device. The first method comprises forming a first silicon film over a semiconductor substrate, forming a second silicon film on the first silicon film, forming a third silicon film on the second silicon film, forming a first diffusion barrier film on the third silicon film, and performing a thermal treatment to diffuse an impurity included in the second silicon film into at least the first silicon film and the semiconductor substrate, respectively.

In another embodiment, there is provided a second method of manufacturing a semiconductor device. The second method comprises forming a plurality of semiconductor pillars protruding vertical to a surface of a semiconductor substrate, forming an insulator film that covers side surfaces of grooves sandwiched between the plurality of semiconductor pillars, forming a first silicon film that covers inner surfaces of the grooves, forming, on the first silicon film, a second silicon film including an impurity that is diffused to the semiconductor substrate, forming a third silicon film on the second silicon film, forming, on the third silicon film, a first diffusion barrier film for preventing outer diffusion of the impurity, and forming diffusion layers by thermally diffusing the impurity from the second silicon film into the semiconductor pillars at regions of bottoms of the grooves.

In still another embodiment, there is provided a third method of manufacturing a semiconductor device. The third method comprises forming first and second semiconductor fences protruding to a surface of a semiconductor substrate, forming an insulator film that covers a side surface of a groove sandwiched between the first and second semiconductor fences, forming a first silicon film that covers an inner surface of the groove, forming a second silicon film including an impurity on the first silicon film, forming a third silicon film on the second silicon film, forming, on the third silicon film, a first diffusion barrier film for preventing outer diffusion of the impurity, and forming a diffusion layer by thermally diffusing the impurity from the second silicon film into the first and second semiconductor fences at a bottom part of the groove.

The third method may further comprises removing the first diffusion barrier film, the third silicon film, the second silicon film and the first silicon film, etching the diffusion layer at the bottom part of the groove so that the diffusion layer in the first and second semiconductor fences are left thereafter, etching the semiconductor substrate at the bottom of the groove, forming an insulator to fill the groove, and forming a plurality of semiconductor pillars by dividing the first and second semiconductor fences, wherein the first and second semiconductor fences are divided by etching using a line pattern mask crossing the first and second semiconductor fences.

BRIEF DESCRIPTION OF THE DRAWINGS

The above features and advantages of the present invention will be more apparent from the following description of certain preferred embodiments taken in conjunction with the accompanying drawings.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

A method of manufacturing buried bit lines and buried word lines of a semiconductor device according to a first embodiment of the present invention will be described below with reference to FIGS. 3 to 30 in addition to FIGS. 1 and 2. FIGS. 3 to 20 show a method of manufacturing buried bit lines of a semiconductor device according to a first embodiment of the present invention, and FIGS. 21 to 30 show a method of manufacturing buried word lines of a semiconductor device according to a first embodiment of the present invention.

Figure 1:
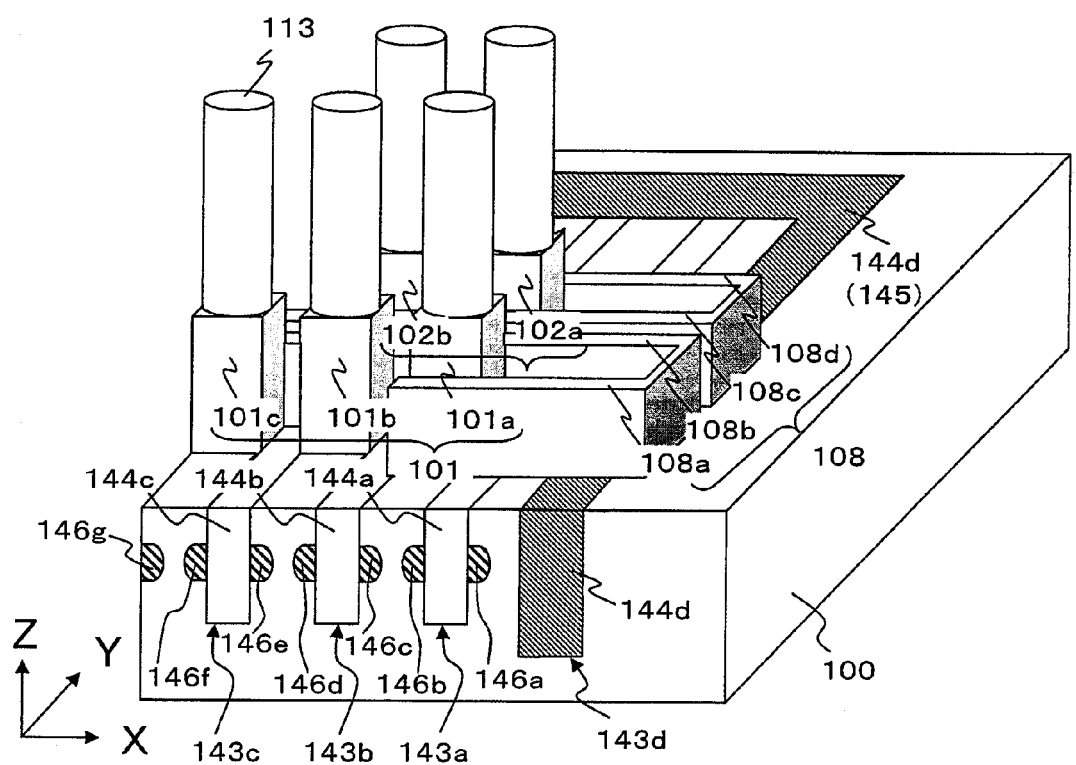
FIG. 1 is a perspective view schematically showing an example of a plurality of vertical transistors, which form memory cells of a DRAM to which the present invention is applicable.
Figure 2:
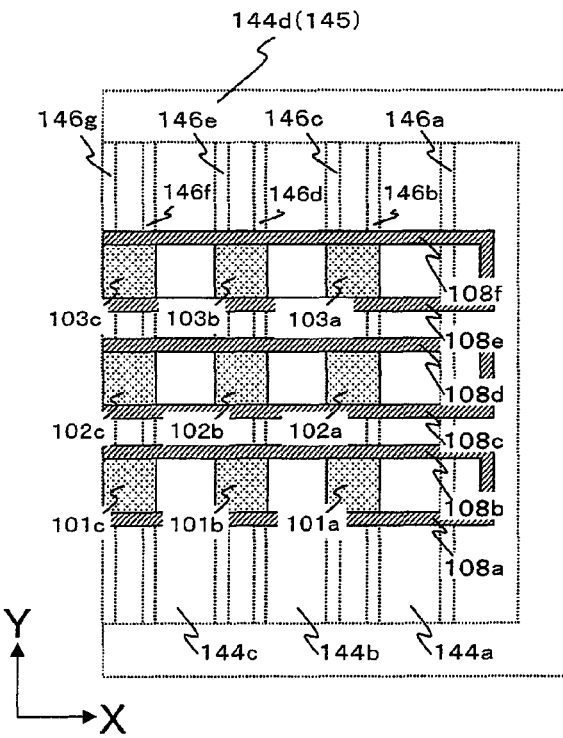
FIG. 2 is a plan view of an arrangement of the vertical transistors as seen from above the vertical transistors in FIG. 1.

First of all, a semiconductor device to which the present invention is applied will be summarized along with an example of a DRAM using FIGS. 1 and 2.

Referring to FIG. 1, as described above, capacitors 113 are formed on silicon pillars 101*a*, 101*b*, 101*c*, 102*a*, and 102*b*, which have been formed by digging a silicon substrate 100. In the following description, the silicon pillars 101*a*, 101*b*, and 101*c* may collectively be referred to as silicon pillars 101, and the silicon pillar 102*a* and 102*b* may collectively be referred to as silicon pillars 102. Word lines 108*a*, 108*b*, 108*c*, and 108*d* form gate electrodes of vertical transistors. The word lines 108*a* and 108*b* are formed so as to interpose the silicon pillars 101 therebetween, whereas the word lines 108*c* and 108*d* are formed so as to interpose the silicon pillars 102 therebetween. In the following description, the word lines 108*a*, 108*b*, 108*c*, and 108*d* may collectively be referred to as word lines 108. Diffusion layers 146*b*, 146*c*, 146*d*, 146*e*, 146*f*, and 146*g* to be bit lines, which may collectively be referred to as diffusion layers 146 in the following description, are located at a height different from the height of the word lines 108. The diffusion layers 146 extend in a direction perpendicular to a direction in which the word lines 108 extend. The diffusion layers 146 are formed within the corresponding silicon pillars 101 and 102. Specifically, each of the word lines 108 extends along the X-direction (or in the X-direction) at a position higher than the height of the diffusion layers 146. Each of the diffusion layers 146 is formed on a side surface of the corresponding silicon pillar. Each of the diffusion layers 146 extends along the Y-direction, which is perpendicular to the X-direction. A transistor constituting a unit cell is formed by two bit lines and two word lines.

For example, the silicon pillar 101*a* includes the diffusion layers 146*b* and 146*c* to be bit lines and a pair of word lines 108*a* and 108*b* connected at ends of a cell region. Similarly, the silicon pillar 102*a* includes the diffusion layers 146*b* and 146c and a pair of word lines 108c and 108d. Other pillars of the silicon pillars 101 and 102 are formed in the same manner. The word lines 108b and 108c are insulated from each other by an insulator film. Thus, a double gate structure having two word lines connected to one silicon pillar is provided. Meanwhile, the diffusion layers to be bit lines are formed on two opposed side surfaces of the silicon pillar. Therefore, the bit lines 146 formed on the silicon pillars are insulated from each other by the insulator films 143 filled between adjacent silicon pillars.

Incidentally, a plurality of silicon pillars can be formed with the following manner. A plurality of silicon fences protruding to a surface of a silicon substrate are formed. A plurality of silicon pillars are formed by dividing each of the silicon fences. For example, each the silicon fences can be divided by etching using a line pattern mask crossing the silicon fences.

Next, referring to FIG. 2, a memory cell to which the present invention is applied has silicon pillars 101a, 101b, and 101c (collectively referred to as silicon pillars 101 in the following description), silicon pillars 102a, 102b, and 102c (collectively referred to as silicon pillars 102 in the following description), and silicon pillars 103a, 103b, and 103c (collectively referred to as silicon pillars 103 in the following description). Those silicon pillars are methodically arranged in the X-direction and the Y-direction, which is perpendicular to the X-direction. For convenience' sake, FIG. 2 illustrates nine silicon pillars. However, the present invention is not limited to the illustrated example. In practice, several thousands to several hundreds of thousands of silicon pillars are arranged. Therefore, the number of bit lines and word lines is on the order of several hundreds to several thousands. In each of the silicon pillars 101, 102, and 103 arranged along the X-direction, diffusion layers 146b, 146c, 146d, 146e, 146f, and 146g to be bit lines are formed so as to extend along the Y-direction. Each of the diffusion layers 146 is shared with a plurality of silicon pillars arranged along the Y-direction. For example, the diffusion layer 146b is shared with the silicon pillars 101a, 102a, and 103a. In FIG. 2, part of word lines is illustrated as being cut out in order to show the reference numerals. However, those word lines are not cut out in practice.

Figure 3:
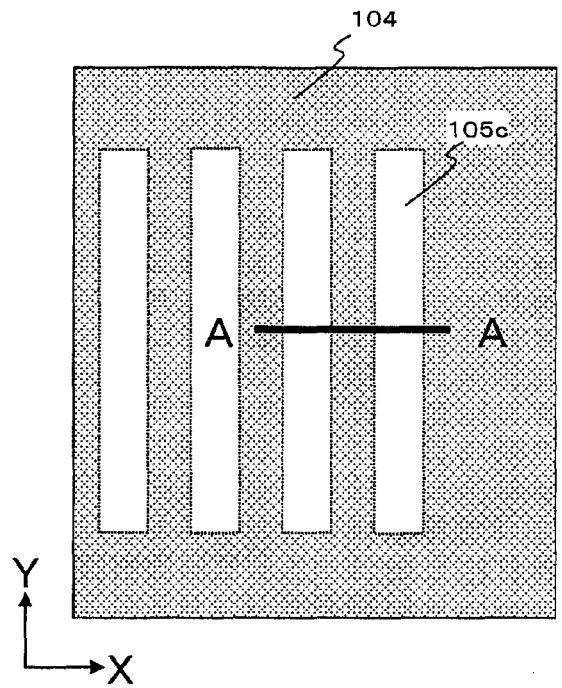
FIG. 3 is a plan view showing an initial stage of a production process until buried bit lines are formed in a method of manufacturing a semiconductor device according to a first embodiment of the present invention.

Now a method of producing buried bit lines in the semiconductor device illustrated in FIGS. 1 and 2 will be described with reference to FIGS. 3 to 20. FIG. 3 is a plan view, FIGS. 4 to 19 are cross-sectional views taken along line A-A of FIG. 3, and FIG. 20 is a plan view of FIG. 19.

Figure 4:
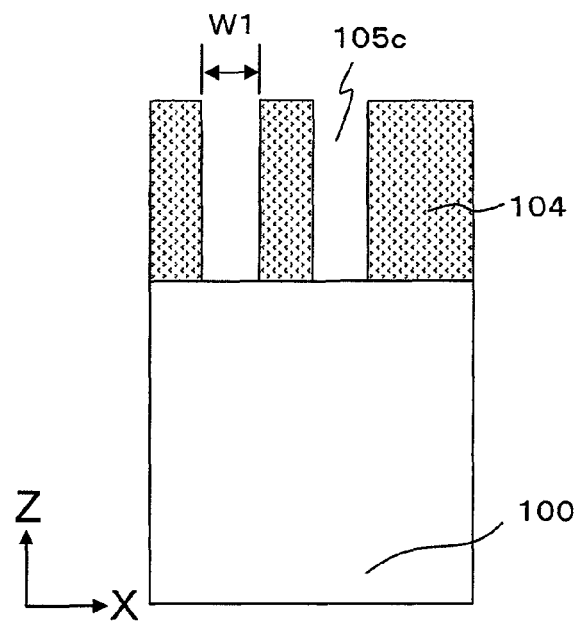
FIG. 4 is a cross-sectional view taken along line A-A of FIG. 3.

As shown in FIG. 4, a mask film 104 of a silicon nitride film is deposited with a thickness of about 40 nm on a silicon substrate (semiconductor substrate) 100 by a low-pressure chemical vapor deposition (CVD) method. Then bit line openings 105c extending along the Y-direction are formed in the mask film 104 by photolithography and dry etching. The silicon substrate 100 is exposed at bottoms of the bit line openings 105c. In the present embodiment, the bit line openings 105c have a width W1 of 45 nm.

Figure 5:
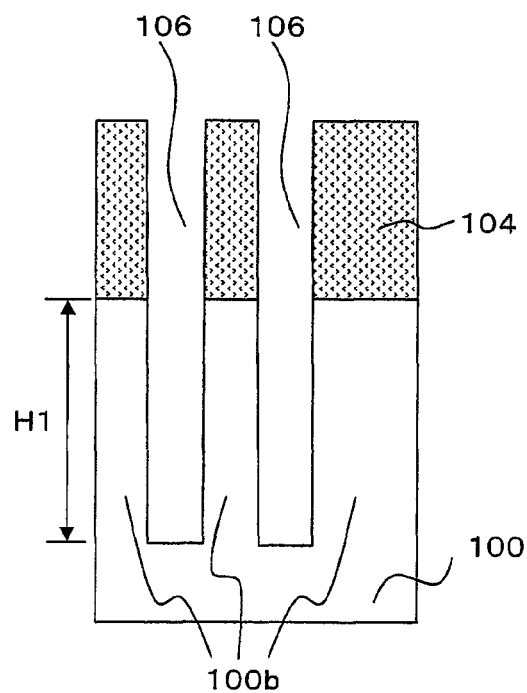
FIG. 5 is a cross-sectional view showing a production step subsequent to FIG. 4 in the method of manufacturing a semiconductor device according to the first embodiment of the present invention.

Thereafter, as shown in FIG. 5, the silicon substrate 100 is subjected to anisotropic dry etching while the mask film 104 is used as a mask. Thus, new trenches 106 are formed in the silicon substrate 100. The trenches 106 have a depth H1 of 200 nm from the surface of the silicon substrate 100. Those trenches 106 are used to form silicon pillars (semiconductor pillars) 100b.

Figure 6:
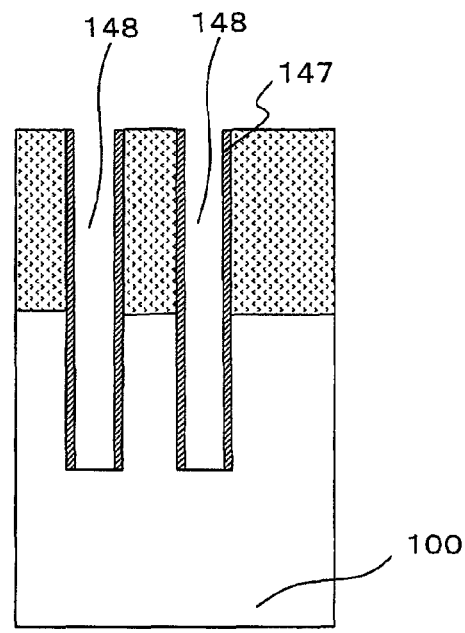
FIG. 6 is a cross-sectional view showing a production step subsequent to FIG. 5.

Subsequently, a silicon oxide film is formed with a film thickness of 2.5 nm by a radical oxidation method so that inner sidewalls of the trenches 106 are covered with the silicon oxide film, and a silicon nitride film is stacked with a film thickness of 5 nm on the silicon oxide film by a thermal CVD method. Then an etchback is performed so as to form an insulator film 147 on the inner sidewalls of the trenches 106 as shown in FIG. 6. At that time, new trenches 148 are formed.

Figure 7:
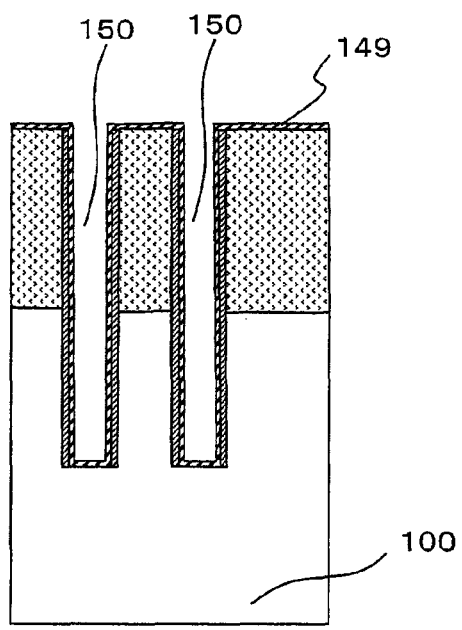
FIG. 7 is a cross-sectional view showing a production step subsequent to FIG. 6.

Next, as shown in FIG. 7, a coating film 149, which is to be a first silicon film, is deposited with a thickness of 5 nm by a CVD method so that inner walls of the trenches 148 are covered with the coating film 149. For example, the following deposition conditions may be used. Monosilane ($SiH_4$) is used as a material gas. A flow rate of the gas is 1,500 sccm (standard cubic centimeter per minute), and a heating temperature is 550° C. The heating temperature is not limited to 550° C. and may be in a range of 500° C. to 600° C. At that time, new trenches 150 are formed.

Figure 8:
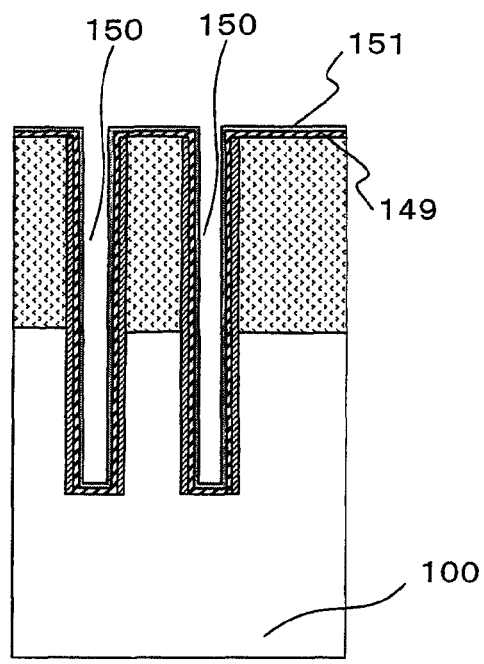
FIG. 8 is a cross-sectional view showing a production step subsequent to FIG. 7.

Then, as shown in FIG. 8, an impurity layer 151, which is to be a second silicon film, is formed on the coating film 149 by adsorbing impurities of arsenic (As) on the exposed coating film 149 so that the concentration of the impurities is $1.0 \times 10^{15}$ atoms/cm$^3$. For example, the following adsorption conditions may be used. Arsine ($AsH_3$) is used as a material gas. A flow rate of the gas is 400 sccm, and a heating temperature is 550° C. The heating temperature is not limited to 550° C. and may be in a range of 500° C. to 600° C. Within this temperature range, arsine is decomposed to produce arsenic. Thus, arsenic can readily be adsorbed on the coating film 149. At that time, the trenches 150 remain.

Figure 9:
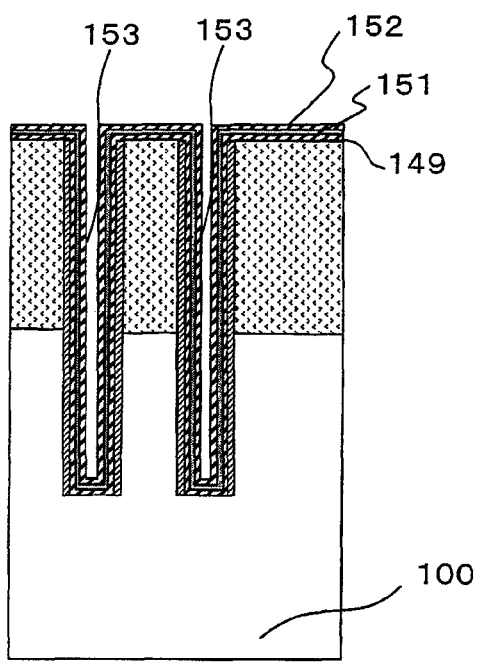
FIG. 9 is a cross-sectional view showing a production step subsequent to FIG. 8.
Figure 10:
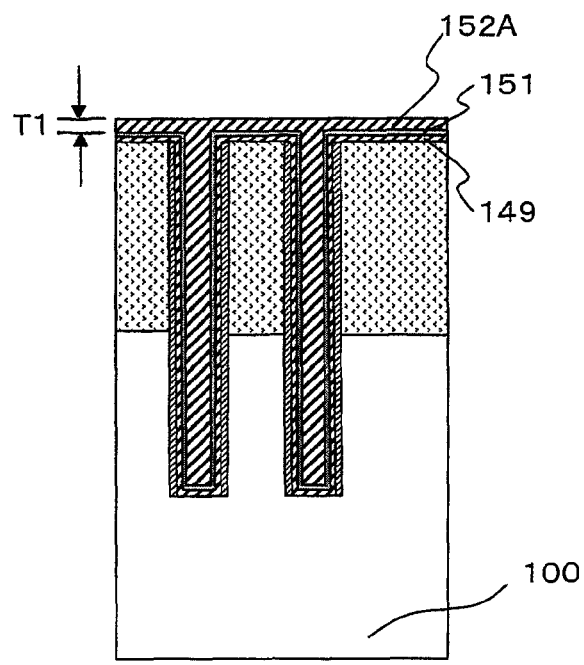
FIG. 10 is a cross-sectional view showing a production step performed instead of the production step shown in FIG. 9.

Thereafter, as shown in FIG. 9, a coating film 152, which is to be a third silicon film, is deposited with a thickness of 8 nm on the impurity layer 151 by a CVD method so that inner walls of the trenches 150 are covered with the coating film 152. For example, the following deposition conditions may be used. Monosilane ($SiH_4$) is used as a material gas. A flow rate of the gas is 1,500 sccm, and a heating temperature is 550° C. The heating temperature is not limited to 550° C. and may be in a range of 500° C. to 600° C. At that time, new trenches 153 are formed. As shown in FIG. 10, instead of FIG. 9 showing a production step of the coating film 152, a coating film 152A (third silicon film) may be deposited on the impurity layer 151 with a thickness T1 of 30 nm from a surface of the impurity layer 151, so that the trenches 150 are filled with the coating film 152A.

Each of the first, second, and third silicon films may be deposited in either an amorphous state or a polycrystalline state. This holds true for a fourth silicon film and a fifth silicon film, which will be described later. Furthermore, each of the first and second silicon films may be formed by a selective epitaxial growth technique. This holds true for a second embodiment, which will be described later.

Figure 11:
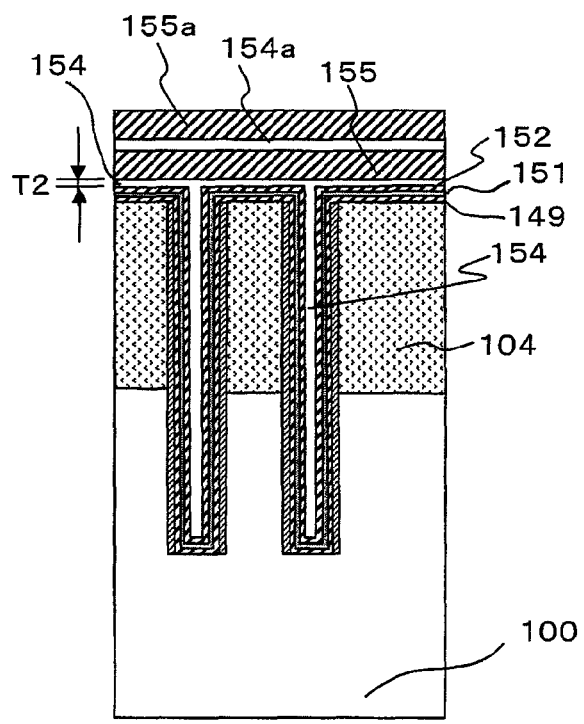
FIG. 11 is a cross-sectional view showing a production step subsequent to FIG. 9.

Next, as shown in FIG. 11 subsequent to FIG. 9, an insulator film 154 of a silicon oxide film, which is to be a first diffusion barrier film, is deposited with a thickness T2 of 3 nm on the coating film 152 by a thermal oxidation method, so that the trenches 153 are filled with the insulator film 154. For example, the following deposition conditions may be used. Oxygen ($O_2$) is used as a material gas. A flow rate of the gas is 3 SLM (standard liter per minute), and a heating temperature is 550° C. The heating temperature is not limited to 550° C. and may be in a range of 500° C. to 600° C. Furthermore, the film thickness of the insulator film 154 is not limited to 3 nm and may be in a range of 2 nm to 3 nm. Then a coating film 155, which is to be a fourth silicon film, is deposited with a thickness of 35 nm on the insulator film 154 by a CVD method. For example, the following deposition conditions may be used. Monosilane ($SiH_4$) is used as a material gas. A flow rate of the gas is 1,500 sccm, and a heating temperature is 550° C. The heating temperature is not limited to 550° C. and may be in a range of 500° C. to 600° C.

Figure 12:
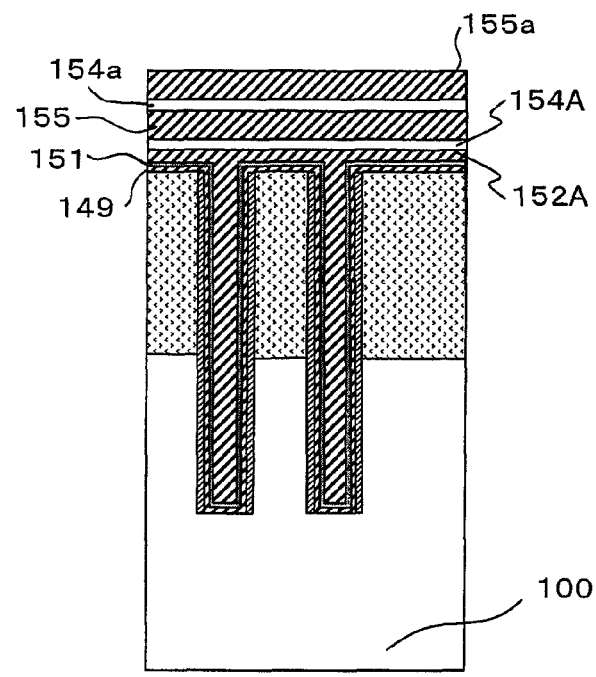
FIG. 12 is a cross-sectional view showing a production step subsequent to FIG. 10.

Then an insulator film 154a of a silicon oxide film, which is to be a second diffusion barrier film, is deposited with a thickness of 3 nm on the coating film 155 by a thermal oxidation method. In FIG. 11, the reference numerals 154 and 154a do not indicate any space or room but indicate insulator films. For example, the same deposition conditions as for the insulator film 154 may be used. Furthermore, a coating film 155a, which is to be a fifth silicon film, is deposited with a thickness of 35 nm on the insulator film 154a by a CVD method. For example, the same deposition conditions as for the coating film 155 may be used. In a case where an insulator film is deposited on the coating film 152A shown in FIG. 10, the insulator film 154A becomes flat as shown in FIG. 12 and covers the coating film 152A. For example, the deposition conditions for the coating film 155, the insulator film 154a, and the coating film 155a may be the same as those described in connection with FIG. 11.

Figure 13:
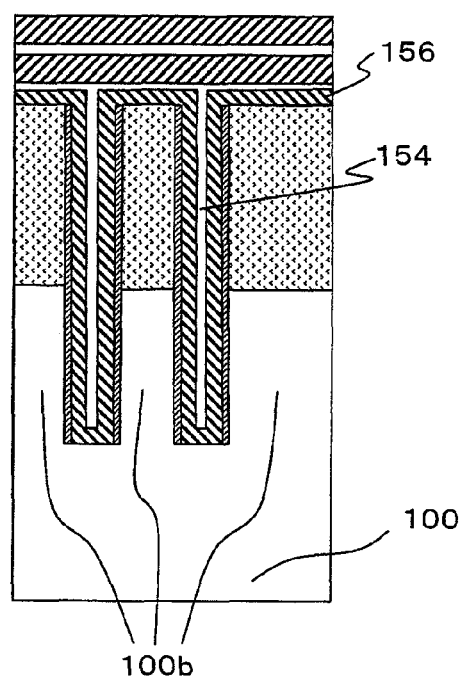
FIG. 13 is a cross-sectional view showing a production step subsequent to FIG. 11.

Thereafter, as shown in FIG. 13 subsequent to FIG. 11, the impurities in the impurity layer 151 (FIG. 11) are thermally diffused into the coating film 149 (FIG. 11) and the coating film 152 (FIG. 11) by a lamp annealing method. At that time, annealing may be conducted under a nitrogen ($N_2$) atmosphere at a heating temperature of 1,000° C. The heating temperature is not limited to 1,000° C. and may be in a range of 800° C. to 1,200° C. As a result of this annealing process, the impurities in the impurity layer 151 are present in the coating films 149 and 152 with a uniform concentration gradient. Those films are incorporated into a doped layer 156. However, since the coating films 149 and 152 have different film thicknesses, they have different impurity concentrations on surfaces opposite to surfaces facing the impurity layer 151 due to a difference of diffusion lengths. More specifically, the arsenic concentration at a contacting surface with the silicon pillars 100b is $2.0 \times 10^{19}$ atoms/cm$^3$, whereas the arsenic concentration at a contacting surface with the insulator film 154 is $2.4 \times 10^{18}$ atoms/cm$^3$.

Figure 14:
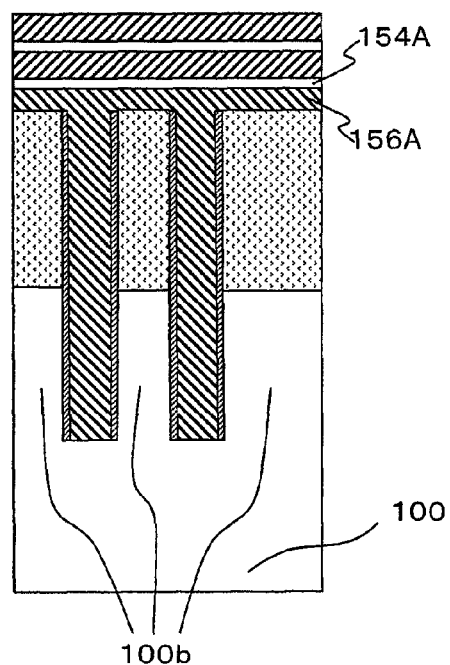
FIG. 14 is a cross-sectional view showing a production step subsequent to FIG. 12.

When the impurity layer 151 shown in FIG. 12 is thermally diffused in the same manner by a lamp annealing method, a doped layer 156A is formed as shown in FIG. 14 so that the impurities in the impurity layer 151 (FIG. 12) are present in the doped layer 156A with a uniform concentration gradient. Since the coating film 152A (FIG. 12) is thicker than the coating film 149 (FIG. 12) in this example, the arsenic concentration at a contacting surface with the insulator film 154A becomes $5.2 \times 10^{17}$ atoms/cm$^3$ and is lower than that in FIG. 13.

Figure 15:
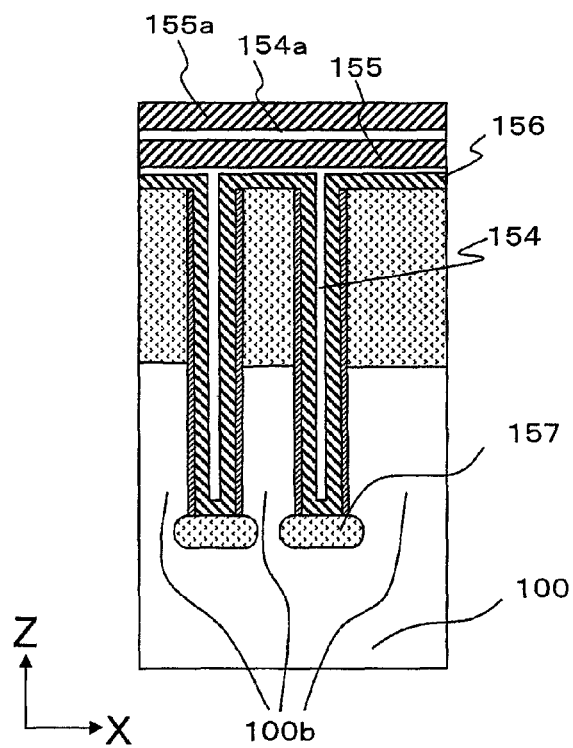
FIG. 15 is a cross-sectional view showing a production step subsequent to FIG. 13.
Figure 16:
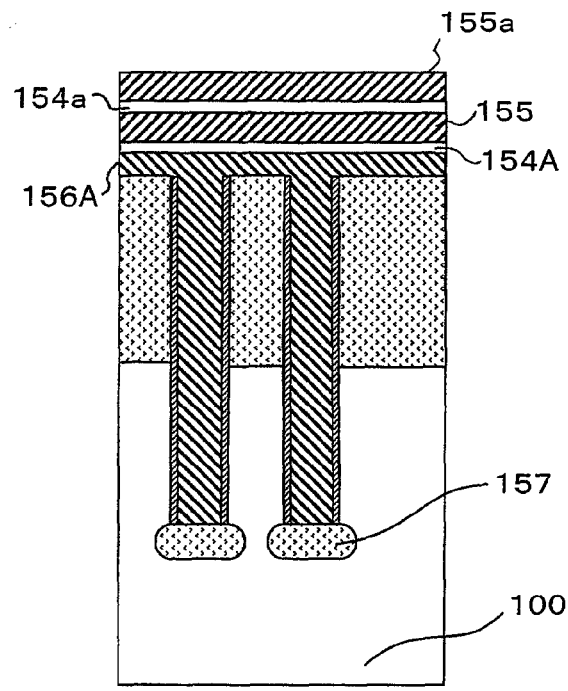
FIG. 16 is a cross-sectional view showing a production step subsequent to FIG. 14.

Subsequently, as shown in FIG. 15 subsequent to FIG. 13, impurities are diffused from the doped layer 156 to the silicon substrate 100 at the bottoms of the trenches by a thermal treatment of 650° C. Thus, diffusion layers 157 are formed at regions corresponding to the bottoms of the trenches. Those impurities are diffused to the silicon substrate 100 not only in the Z-direction, but also in the X-direction. Therefore, part of the diffusion layers 157 is formed on side surfaces of the silicon pillars 100b. By a production step using the same thermal treatment as described in connection with FIG. 15, impurities are diffused from the doped layer 156A shown in FIG. 14 so that a similar diffusion layer 157 is formed at regions corresponding to the bottoms of the trenches as shown in FIG. 16.

Figure 17:
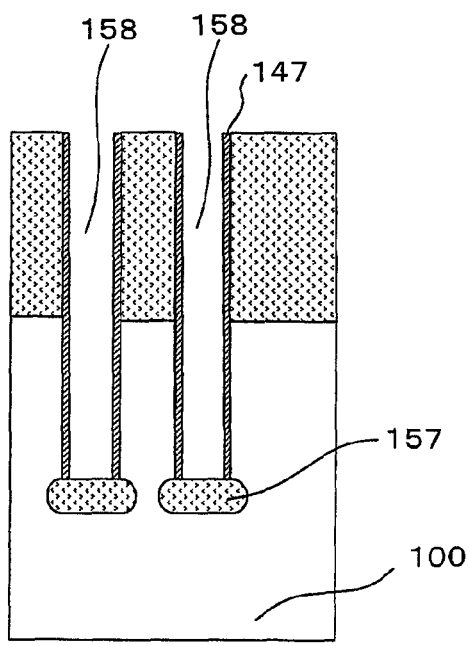
FIG. 17 is a cross-sectional view showing a production step subsequent to FIG. 15 or 16.

Next, as shown in FIG. 17, the coating film 155 (including 155a), the insulator film 154 (including 154a), and the doped layer 156 shown in FIG. 15 are removed by anisotropic dry etching. Thus, new trenches 158 are formed. Part of the diffusion layer 157 is exposed at the bottom of each of the trenches 158. When the coating film 155 (including 155a), the insulator film 154A (including 154a), and the doped layer 156A are removed from the structure shown in FIG. 16, the structure illustrated in FIG. 17 is produced.

Figure 18:
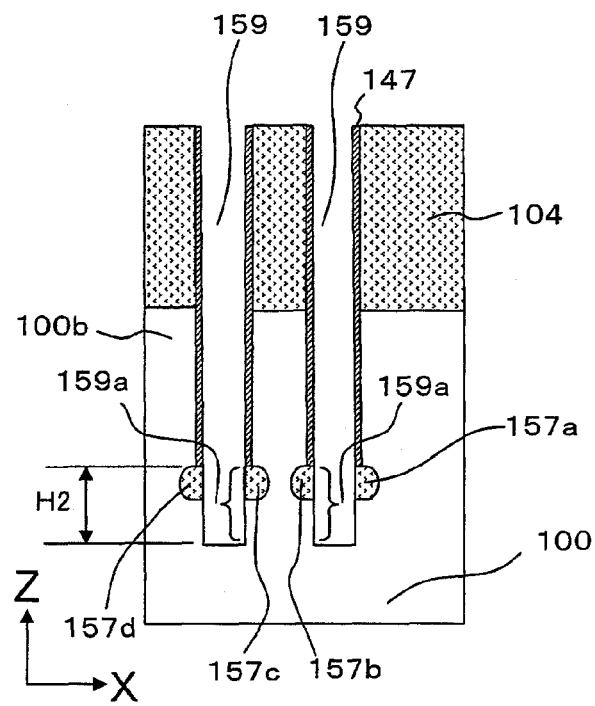
FIG. 18 is a cross-sectional view showing a production step subsequent to FIG. 17.

Then, as shown in FIG. 18, the silicon substrate 100 is subjected to anisotropic dry etching while the mask film 104 is used as a mask. Thus, new trenches 159 including trenches 159a having a depth H2 of 50 nm from the bottoms of the trenches 158 are formed. Those trenches 159a divide the diffusion layers 157 into two parts in the X-direction. Accordingly, new diffusion layers 157a, 157b, 157c, and 157d are formed within the silicon pillars 100b.

Figure 19:
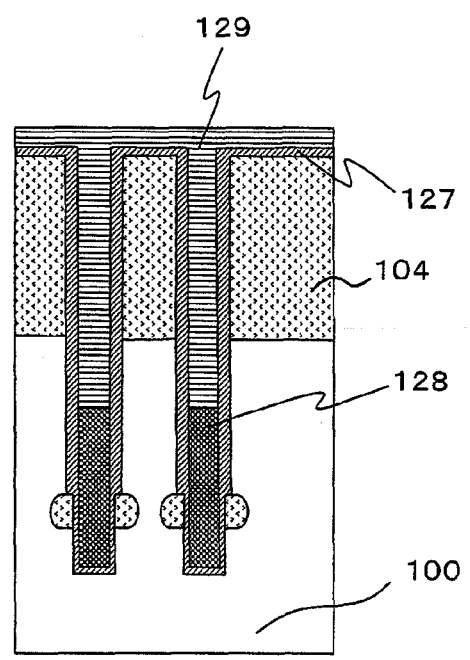
FIG. 19 is a cross-sectional view showing a production step subsequent to FIG. 18.
Figure 20:
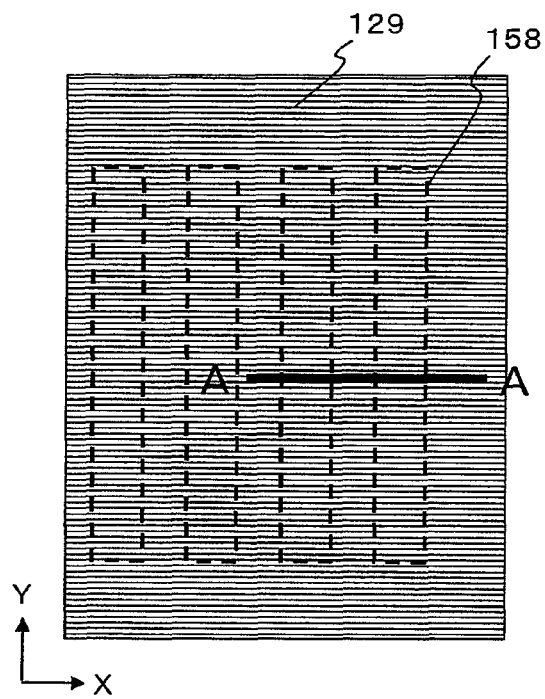
FIG. 20 is a plan view of FIG. 19.

Thereafter, as shown in FIG. 19, an insulator film 127 of a silicon nitride film is formed with a thickness of 5 nm on the entire surface including inner surfaces of the trenches 159 by a CVD method. Furthermore, the trenches 159 are filled with a silicon oxide film by a spin coating method, and an etchback is performed. Thus, an insulator film 128 of a silicon oxide film is formed with a thickness of 120 nm. Therefore, the trenches 159 still remain in a shallowed state above the insulator film 128. Then an insulator film 129 of a silicon oxide film is formed by a CVD method so that the shallowed trenches 159 are filled with the insulator film 129. FIG. 20 shows a plan view at that time. As with FIG. 3, a plurality of lines of the insulator film 129 filled in the trenches 158 (FIG. 17) extend along the Y-direction in parallel to each other.

By the aforementioned production steps, the diffusion layers 157a, 157b, 157c, and 157d as buried bit lines are completed.

Figure 21:
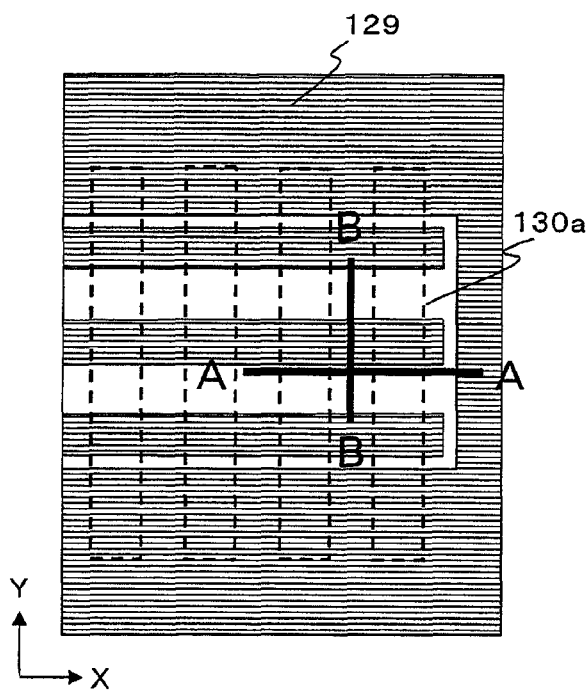
FIG. 21 is a plan view showing an initial stage of a production process until buried word lines are formed in the method of manufacturing a semiconductor device according to the first embodiment of the present invention.

Next, a method of producing buried word lines, which follows FIG. 20, will be described with reference to FIGS. 21 to 30. FIGS. 21 and 30 are plan views, FIGS. 22A to 29A are cross-sectional views taken along line A-A of FIG. 21, and FIGS. 22B to 29B are cross-sectional views taken along line B-B of FIG. 21. FIGS. 22A to 29A illustrate the same portions as shown in the cross-sectional views for the aforementioned method of producing buried bit lines. FIGS. 22A to 29A are provided for clarifying a positional relationship between the word lines and the bit lines. FIGS. 22B to 29B show a positional relationship between word lines located adjacent to each other in a direction perpendicular to the bit lines.

Figure 22A:
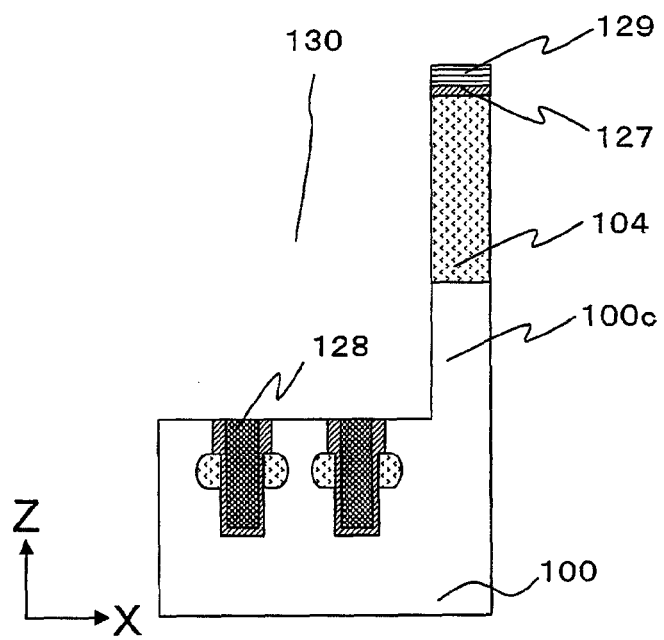
FIG. 22A is a cross-sectional view taken along line A-A of FIG. 21, which shows a production step subsequent to FIG. 21.
Figure 22B:
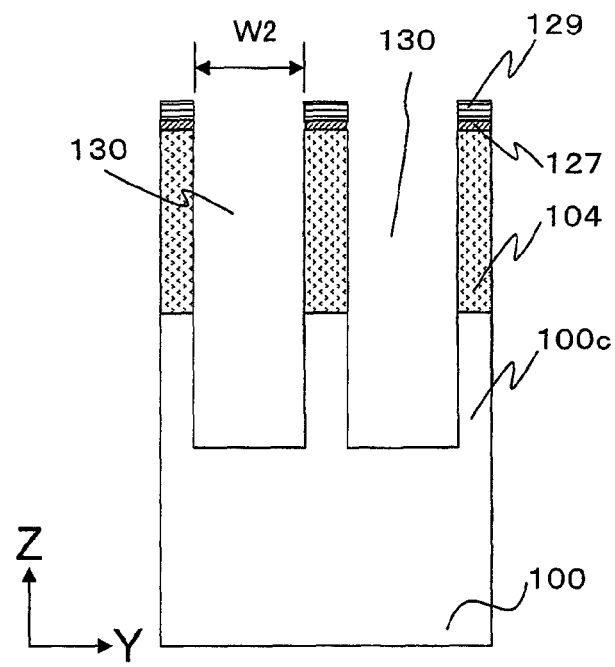
FIG. 22B is a cross-sectional view taken along line B-B of FIG. 21, which shows the production step of FIG. 22A from another angle.

As shown in the plan view of FIG. 21, a word line opening 130a extending along the X-direction is formed in the mask film 104 and the silicon substrate 100, which is to be silicon pillars 100c (semiconductor pillars 100c) (FIGS. 22A and 22B), by photolithography and dry etching. As shown in FIGS. 22A and 22B, the silicon substrate 100 and the insulator film 128 are exposed at the bottoms of trenches 130 of the word line opening 130a (FIG. 21). In the present embodiment, the trenches 130 have a width W2 of 63 nm.

Figure 23A:
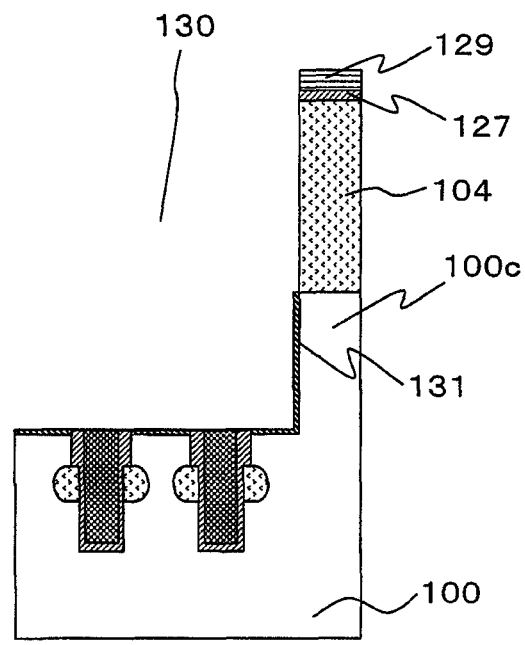
FIG. 23A is a cross-sectional view showing a production step subsequent to FIG. 22A.
Figure 23B:
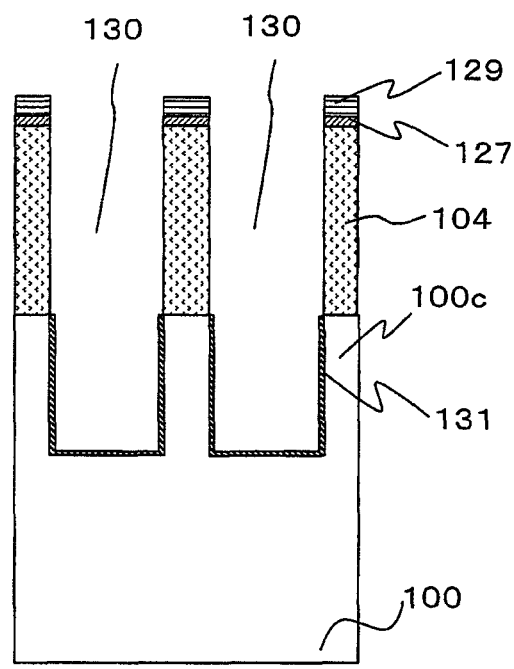
FIG. 23B is a cross-sectional view showing the production step of FIG. 23A from another angle as with FIG. 22B.

Thereafter, as shown in FIGS. 23A and 23B, an insulator film 131 of a silicon oxide film is formed with a thickness of 10 nm on the trenches 130 of the silicon substrate 100 by a thermal oxidation method. At that time, sidewall portions of the silicon pillars 100c (semiconductor pillars 100c) and an upper surface of the silicon substrate 100 (bottoms of the trenches 130) are covered with the insulator film 131, which is to be a gate insulator film.

Figure 24A:
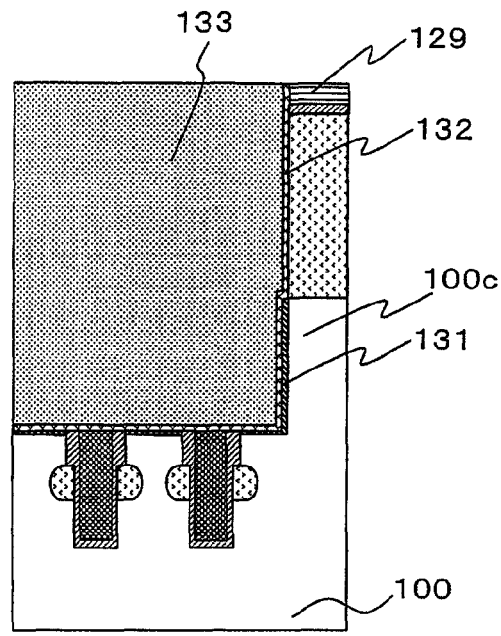
FIG. 24A is a cross-sectional view showing a production step subsequent to FIG. 23A.
Figure 24B:
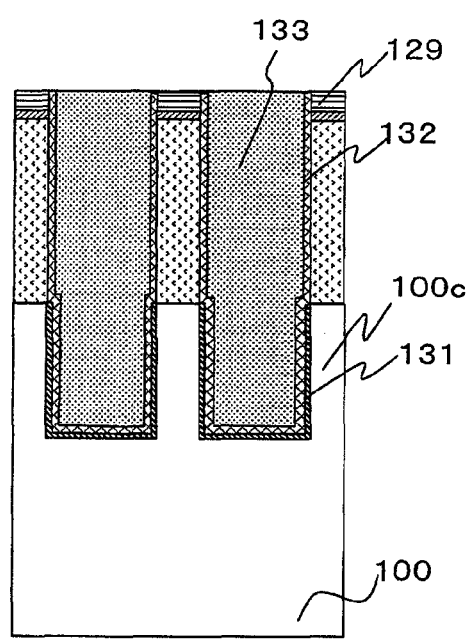
FIG. 24B is a cross-sectional view showing the production step of FIG. 24A from another angle as with FIG. 23B.

Subsequently, as shown in FIGS. 24A and 24B, a barrier film 132 of a titanium nitride is formed with a thickness of 4 nm on the entire surface including inner surfaces of the trenches 130 by a CVD method. Furthermore, a conductive film 133 of tungsten is formed by a CVD method so that the trenches 130 are filled with the conductive film 133. Then the conductive film 133 present on the insulator film 129 is removed by a chemical mechanical polishing (CMP). At that time, as shown in FIG. 24B, the silicon pillars 100c (semiconductor pillars 100c) are covered with the insulator film 131, which is to be a gate insulator film, the barrier film 132, and the conductive film 133.

Figure 25A:
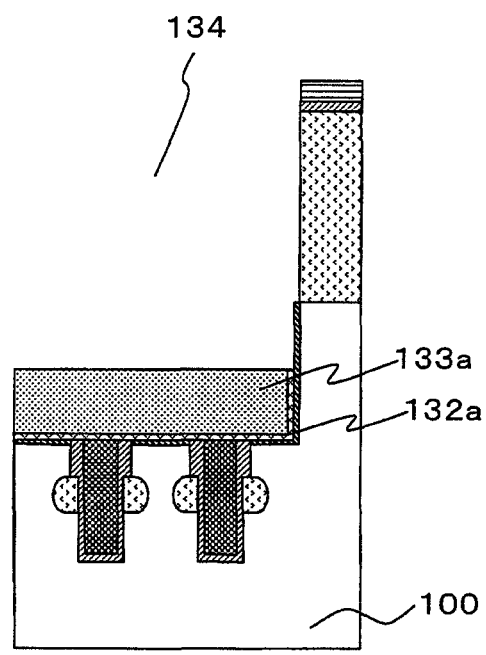
FIG. 25A is a cross-sectional view showing a production step subsequent to FIG. 24A.
Figure 25B:
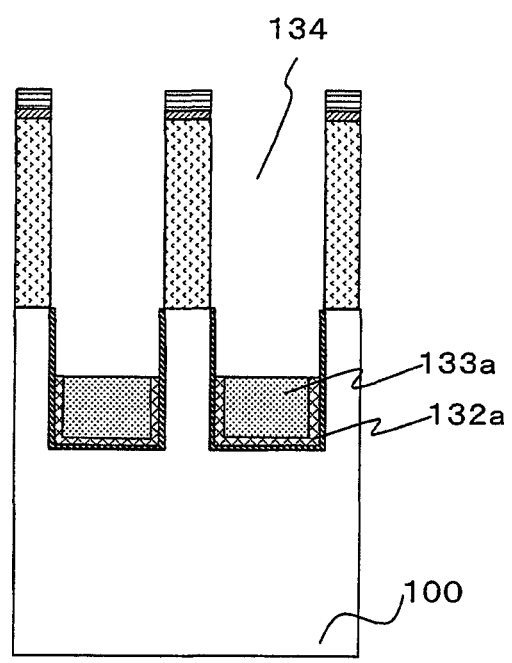
FIG. 25B is a cross-sectional view showing the production step of FIG. 25A from another angle as with FIG. 24B.

Next, as shown in FIGS. 25A and 25B, an etchback is performed on the conductive film 133 to produce conductive films 133a having a thickness of 50 nm. Thus, new trenches 134 are formed. Under the etchback conditions, the barrier film 132 is also removed at the same rate as the conductive film 133. Therefore, as shown in FIG. 25B, no barrier film 132 is left on side surfaces of the trenches 134. Thus, the barrier film 132 remains at the bottoms of the trenches 134 as a barrier film 132a covering bottoms and sidewall portions of the conductive films 133a.

Figure 26A:
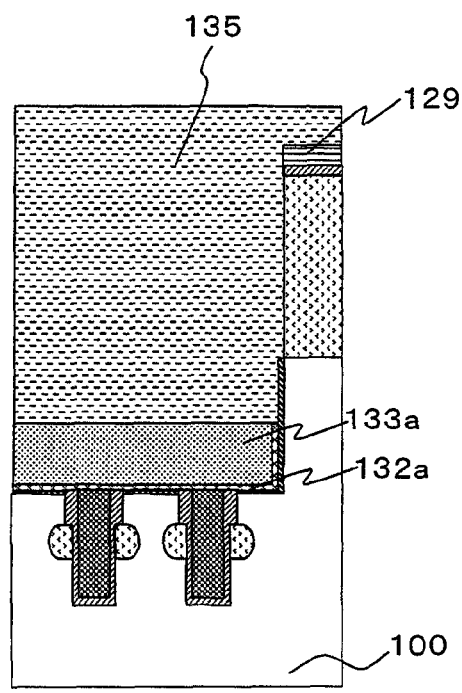
FIG. 26A is a cross-sectional view showing a production step subsequent to FIG. 25A.
Figure 26B:
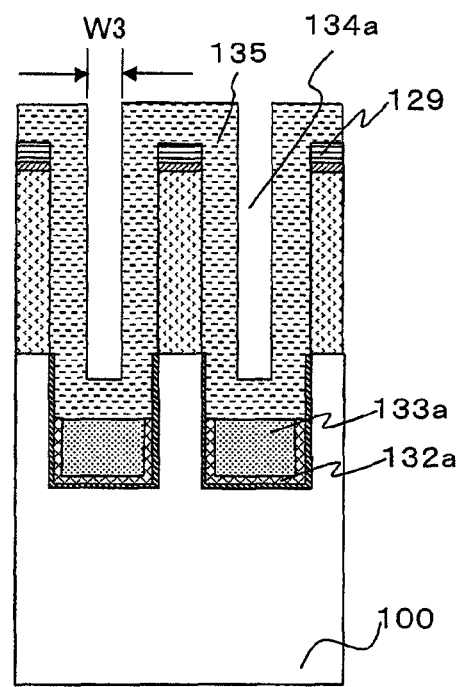
FIG. 26B is a cross-sectional view showing the production step of FIG. 26A from another angle as with FIG. 25B.

Then, as shown in FIGS. 26A and 26B, an insulator film 135 of a silicon oxide film is deposited with a thickness of 18 nm by a CVD method so that inner walls of the trenches 134 are covered with the insulator film 135. This insulator film 135 is deposited with a uniform thickness. Therefore, as shown in FIG. 26B, new trenches 134a having a width W3 of 27 nm are formed. FIG. 26A shows a cross-section of the insulator film 135 deposited on a sidewall portion of the trench 134a. The insulator film 135 also covers an upper surface of the insulator film 129.

Figure 27A:
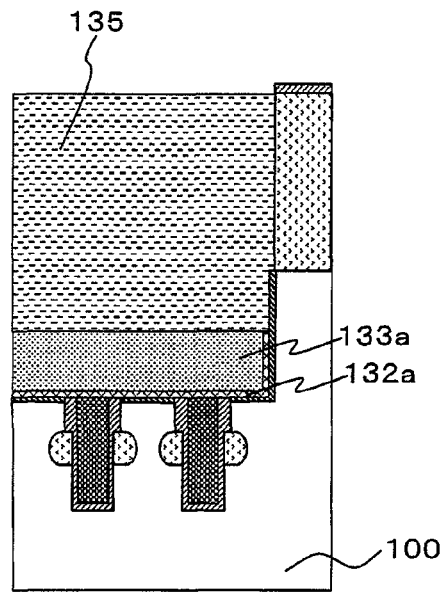
FIG. 27A is a cross-sectional view showing a production step subsequent to FIG. 26A.
Figure 27B:
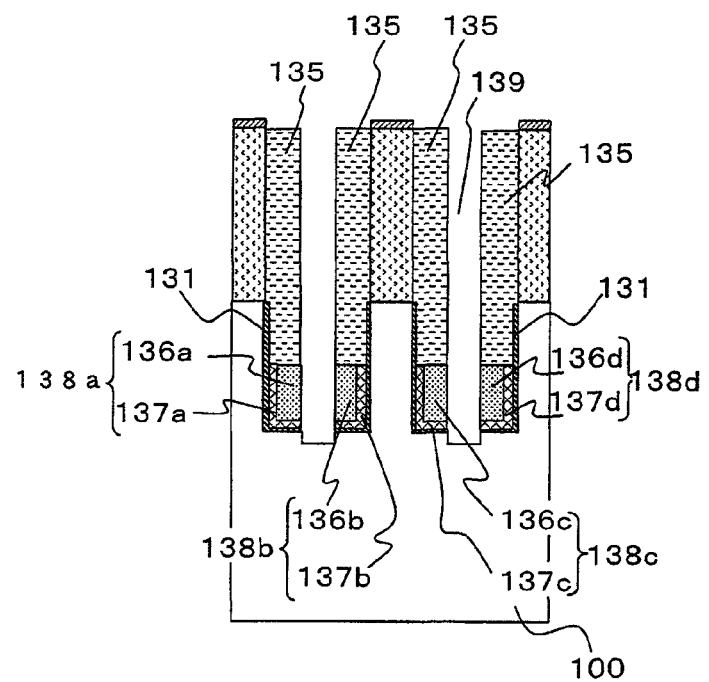
FIG. 27B is a cross-sectional view showing the production step of FIG. 27A from another angle as with FIG. 26B.

Thereafter, as shown in FIGS. 27A and 27B, the insulator film 135 is divided at the trenches 134a by an etchback. Similarly, the conductive film 133a and the barrier film 132a are divided to produce conductive films 136a, 136b, 136c, and 136d and barrier films 137a, 137b, 137c, and 137d. The conductive film 136a and the barrier film 137a form a word line 138a on the insulator film 131, which is to be a gate insulator film. A word line 138b, a word line 138c, and a word line 138d are formed in the same manner. The word line 138b and the word line 138c jointly cover side surfaces of the silicon pillars 100c (semiconductor pillars 100c) and serve as double gates. Although word lines to be paired with the word lines 138a and 138d are not illustrated in the drawings, the word lines 138a and 138d also serve as double gates. New trenches 139 are formed by an etchback. In order to prevent adjacent word lines 138a to 138d from being short-circuited, the trenches 139 are formed such that their bottoms are located at a position lower than bottoms of the barrier films 137a to 137d.

Figure 28A:
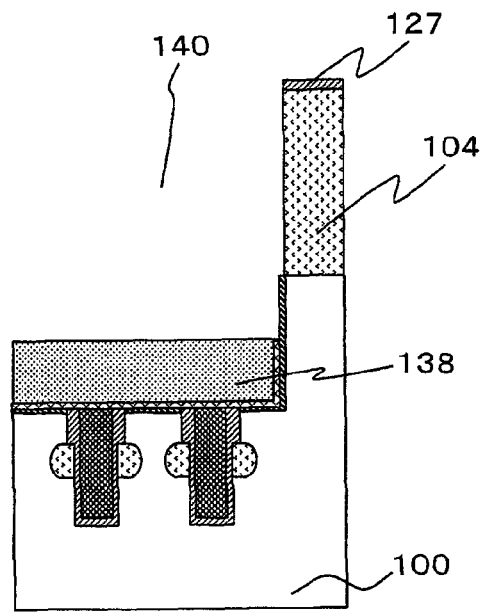
FIG. 28A is a cross-sectional view showing a production step subsequent to FIG. 27A.
Figure 28B:
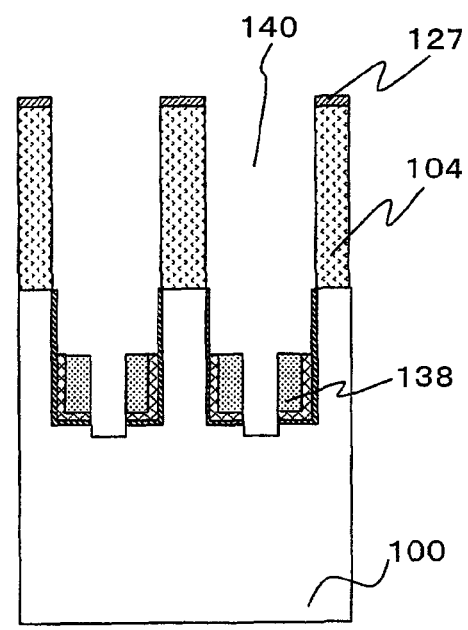
FIG. 28B is a cross-sectional view showing the production step of FIG. 28A from another angle as with FIG. 27B.

Subsequently, as shown in FIGS. 28A and 28B, the insulator film 135 of a silicon oxide film remaining in the trenches 139 is removed by wet etching. Thus, new trenches 140 are formed. At that time, the word lines 138 of tungsten and titanium nitride, the mask film 104 of a silicon nitride film, and the insulator film 127 are not removed.

Figure 29A:
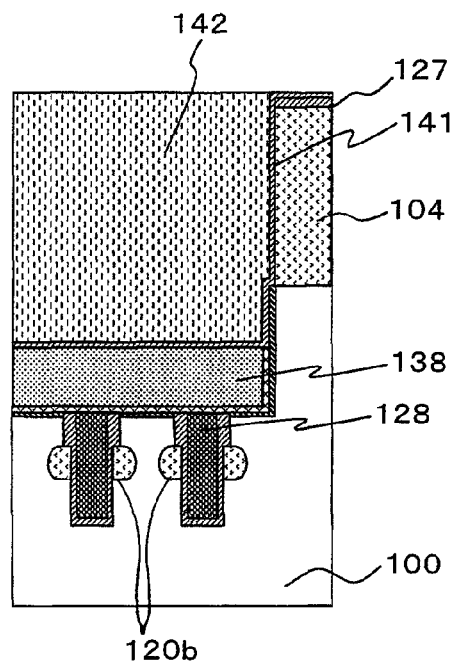
FIG. 29A is a cross-sectional view showing a production step subsequent to FIG. 28A.
Figure 29B:
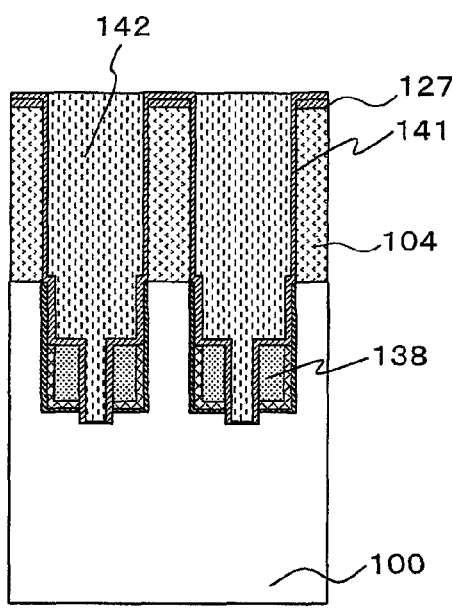
FIG. 29B is a cross-sectional view showing the production step of FIG. 29A from another angle as with FIG. 28B.
Figure 30:
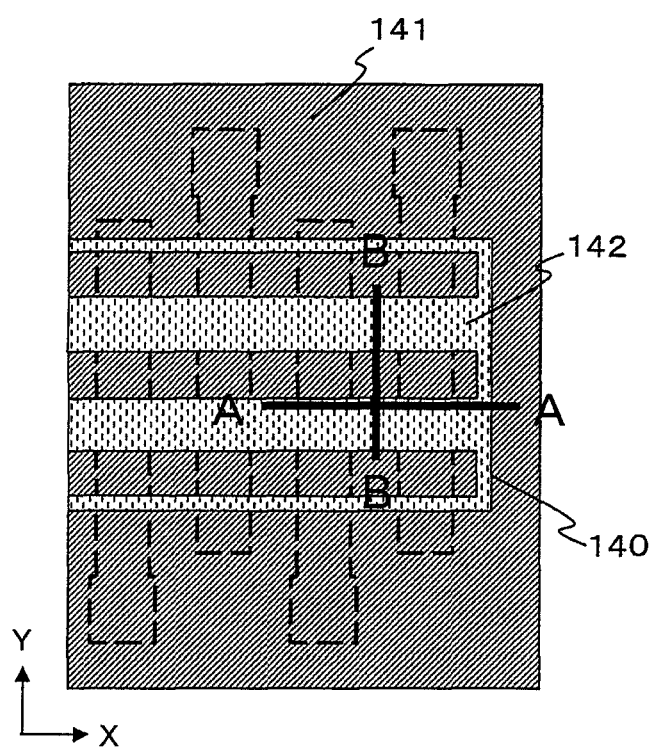
FIG. 30 is a plan view of FIG. 29A or 29B.

Next, as shown in FIGS. 29A and 29B, an insulator film 141 of a silicon nitride film is deposited with a thickness of 8 nm by a CVD method so that inner walls of the trenches 140 are covered with the insulator film 141. Furthermore, an insulator film 142 of a silicon oxide film is formed by a spin coating method so that the trenches 140 are filled with the insulator film 142. Then the insulator film 142 on the insulator film 141 is removed and flattened by CMP. FIG. 30 is a plan view of FIG. 29A or 29B. As with FIG. 21, the trenches 140 in which the word lines 138 have been buried extend along the X-direction in parallel to each other. The trenches are not isolated at their right ends because an electrical control is collectively performed by incorporating the aforementioned two word lines having a double gate structure at their ends. As shown in FIG. 29A, the bit lines 120b are insulated from the word lines 138 by the insulator films 128.

Then, the mask film 104 is removed. A semiconductor device, which corresponds to the DRAM shown in FIG. 1, is completed through a process of forming diffusion layers at upper portions of the silicon pillars, a process of forming capacitance contact plugs, a process of forming capacitors, a process of forming a wiring layer, and the like.

Meanwhile, diffusion layers are usually formed in the following manner. Referring back to FIG. 6, the silicon pillars 100b, which form side surfaces of the trenches 148, are covered with the insulator film 147. Then impurities are implanted in the silicon substrate 100 exposed at the bottoms of the trenches 148 by an ion implantation method. Thus, diffusion layers 157 as shown in FIG. 15 are formed. At that time, if an angle of the ion implantation exceeds a control limit, impurities are also implanted in the insulator film 147, which covers channel regions of transistors. As a result, as described in SUMMARY, part of the impurities going through the insulator film 147 reaches the channel regions in the silicon pillars 100b, thereby causing malfunction of the transistors.

In the aforementioned embodiment, however, the diffusion layers 157 (FIG. 15) are formed by thermally diffusing impurities in the silicon substrate 100 exposed at the bottoms of the trenches 148 (FIG. 6). At that time, the impurities thermally diffused in the silicon substrate 100 can readily be diffused to the silicon pillars 100b. Therefore, the diffusion layers 157a-157d (FIG. 18), which serve as one of a source and a drain (S/D), can readily be formed right below the channel regions.

Figure 31:
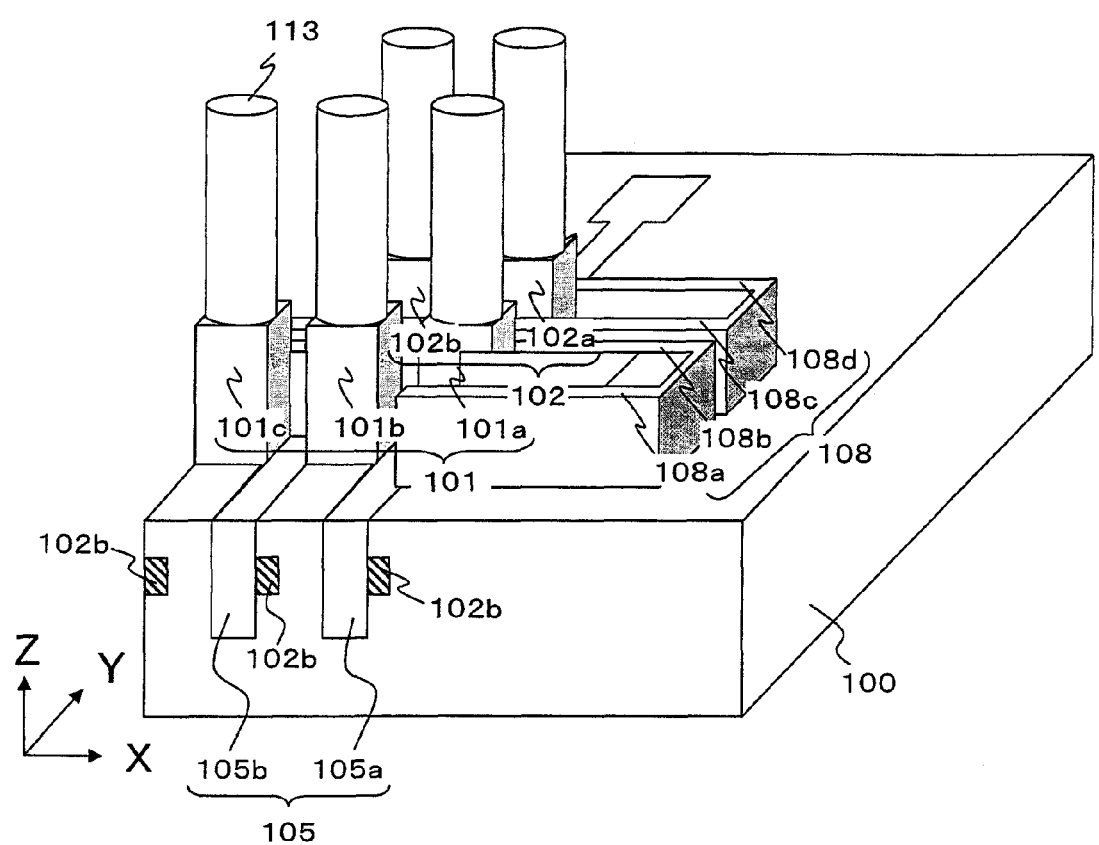
FIG. 31 is a perspective view explanatory of a summary of another example of a plurality of vertical transistors, which form memory cells of a DRAM to which the present invention is applicable.
Figure 32:
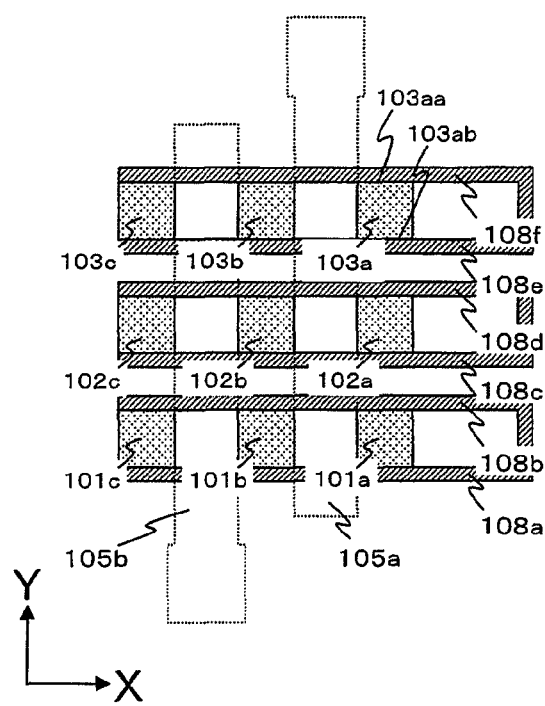
FIG. 32 is a plan view of an arrangement of the vertical transistors as seen from above the vertical transistors in FIG. 31.

A production process of buried bit lines of a semiconductor device according to a second embodiment of the present invention will be described below with reference to FIGS. 31 to 67. FIG. 31 is a perspective view schematically showing a semiconductor device to which the present invention is applied, and FIG. 32 is a plan view of the semiconductor device. FIGS. 33 to 67 show a production process of buried bit lines of a semiconductor device according to the present invention.

A semiconductor device to which the present invention is applied will be summarized along with an example of a DRAM using FIGS. 31 and 32. FIG. 31 is a perspective view showing part of a memory cell portion of a DRAM. FIG. 32 is a plan view corresponding to FIG. 31.

First, referring to FIG. 31, capacitors 113 are formed on silicon pillars 101a, 101b, 101c, 102a, and 102b, which have been formed by digging a semiconductor substrate 100 of silicon. Word lines 108a, 108b, 108c, and 108d form gate electrodes of vertical transistors. The word lines 108a, 108b, 108c, and 108d and the bit lines 105a and 105b are formed so as to surround the corresponding silicon pillars 101 and 102. The word lines 108a, 108b, 108c, and 108d and the bit lines 105a and 105b extend in perpendicular directions at different heights. Specifically, the word lines 108 extend along the X-direction at a location higher than the bit lines 105, whereas the bit lines 105 extend along the Y-direction, which is perpendicular to the X-direction, at the deepest portions of the trenches. A transistor constituting a unit cell is formed by one bit line and two word lines. For example, the silicon pillar 101a includes a bit line 105a and a pair of word lines 108a and 108b connected at ends of a cell region. Similarly, the silicon pillar 102a includes a bit line 105a and a pair of word lines 108c and 108d. Other pillars of the silicon pillars 101 and 102 are formed in the same manner.

The word lines 108b and 108c are insulated from each other by an insulator film. Thus, a double gate structure having two word lines connected to one silicon pillar is provided. A bit line is connected only to one side of each silicon pillar. Therefore, the bit lines are disconnected from a silicon pillar opposite to the silicon pillar being connected by an insulator film (silicon oxide film) formed on a side surface of the silicon pillar. The insulator film is opened only on the side of the silicon pillar being connected. The bit lines are connected to diffusion layers formed within the silicon pillars. Accordingly, the bottoms of the bit lines are insulated from the silicon substrate by an insulator film. Thus, the semiconductor device of the second embodiment has the same basic configuration as in FIG. 1, which has been described in the description of SUMMARY.

Referring to FIG. 32, in the memory cell according to the second embodiment, silicon pillars 101a, 101b, 101c, 102a, 102b, 102c, 103a, 103b, and 103c are methodically arranged in the X-direction and the Y-direction, which is perpendicular to the X-direction. For convenience' sake, FIG. 32 illustrates nine silicon pillars. However, the present invention is not limited to the illustrated example. In practice, several thousands to several hundreds of thousands of silicon pillars are arranged. Therefore, the number of bit lines and word lines is on the order of several hundreds to several thousands. Bit lines 105a and 105b are formed so as to extend along the Y-direction between the silicon pillars 101 and between the silicon pillars 102, which are arranged along the X-direction. Each of the bit lines 105 is shared with a plurality of silicon pillars arranged along the Y-direction. For example, the bit line 105a is shared with the silicon pillars 101a, 102a, and 103a.

Figure 33:
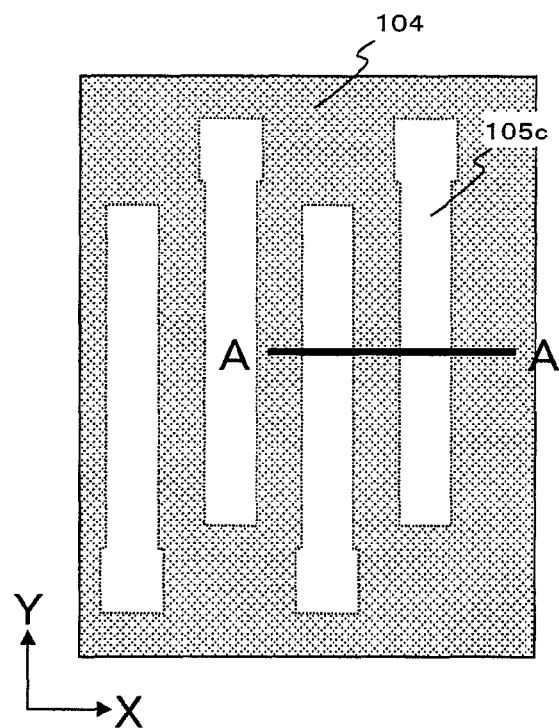
FIG. 33 is a plan view showing an initial stage of a production process until buried bit lines are formed in a method of manufacturing a semiconductor device according to a second embodiment of the present invention.

Now a method of producing buried bit lines in the semiconductor device illustrated in FIGS. 31 and 32 will be described with reference to FIGS. 33 to 67. FIGS. 33 and 67 are plan views, and FIGS. 34 to 66 are cross-sectional views taken along line A-A of FIG. 33.

Figure 34:
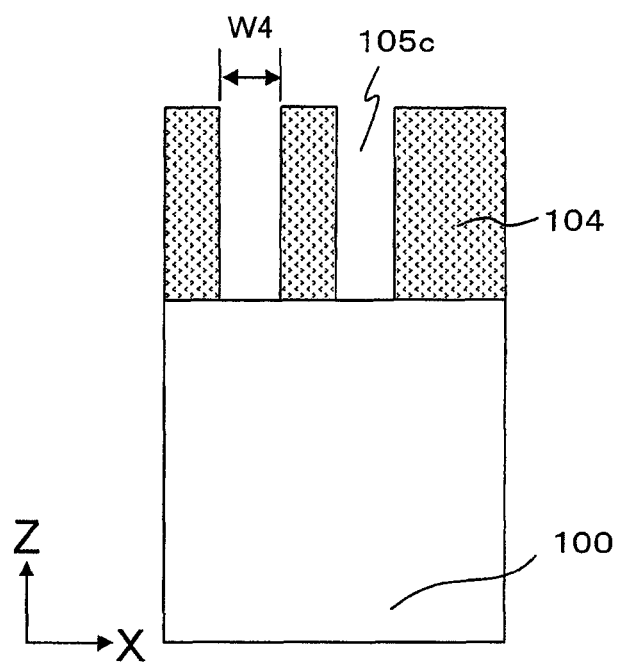
FIG. 34 is a cross-sectional view taken along line A-A of FIG. 33.

As shown in FIG. 34, a mask film 104 of a silicon nitride film is deposited with a thickness of about 40 nm on a silicon substrate (semiconductor substrate) 100 by a low-pressure chemical vapor deposition (CVD) method.

Then bit line openings 105c extending along the Y-direction are formed in the mask film 104 by photolithography and dry etching. As shown in the plan view of FIG. 33, an end of each of the bit line openings 105c is used as an area at which a contact is to be formed and is thus slightly widened. Nevertheless, such a configuration exerts no adverse influence on the formation of bit lines. The silicon substrate (semiconductor substrate) 100 is exposed at the bottoms of the bit line openings 105c. In the second embodiment, the openings 105c have a width W4 of 45 nm.

Figure 35:
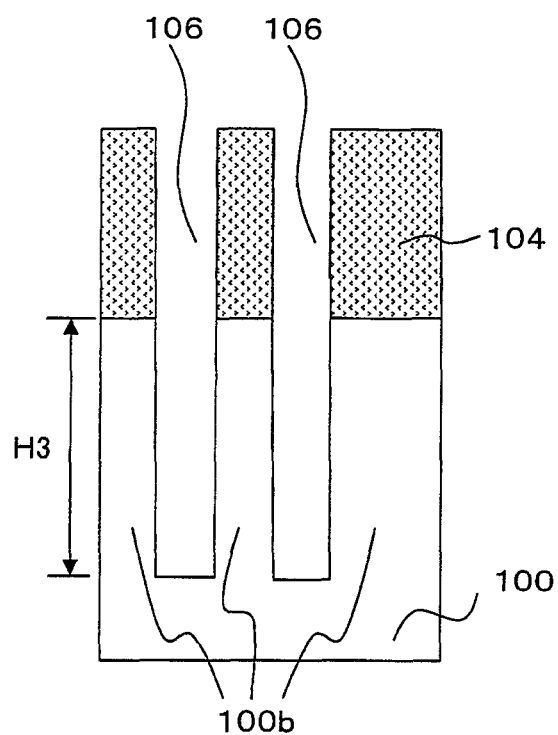
FIG. 35 is a cross-sectional view showing a production step subsequent to FIG. 34.

Thereafter, as shown in FIG. 35, the silicon substrate (semiconductor substrate) 100 is subjected to anisotropic dry etching while the mask film 104 is used as a mask. Thus, trenches 106 are formed in the silicon substrate 100. The trenches 106 have a depth H3 of 250 nm from the surface of the silicon substrate 100. Those trenches 106 are used to form a plurality of silicon pillars (semiconductor pillars) 100b.

Figure 36:
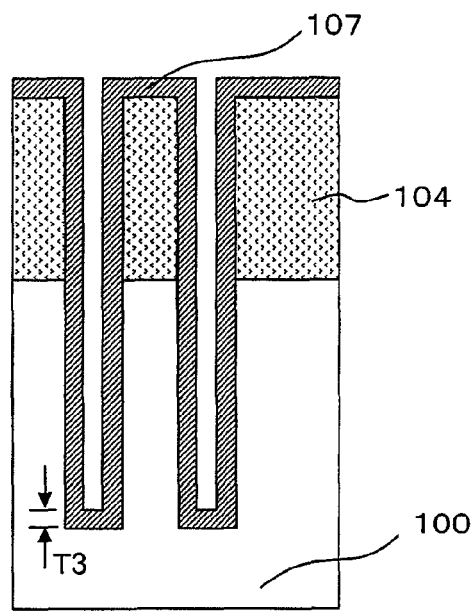
FIG. 36 is a cross-sectional view showing a production step subsequent to FIG. 35.

Subsequently, as shown in FIG. 36, an insulator film 107 of a silicon oxide film is formed on inner walls of the trenches 106 and an upper surface of the mask film 104 by a radical oxidation method so that it has a film thickness T3 of 10 nm at bottoms of the trenches 106.

Figure 37:
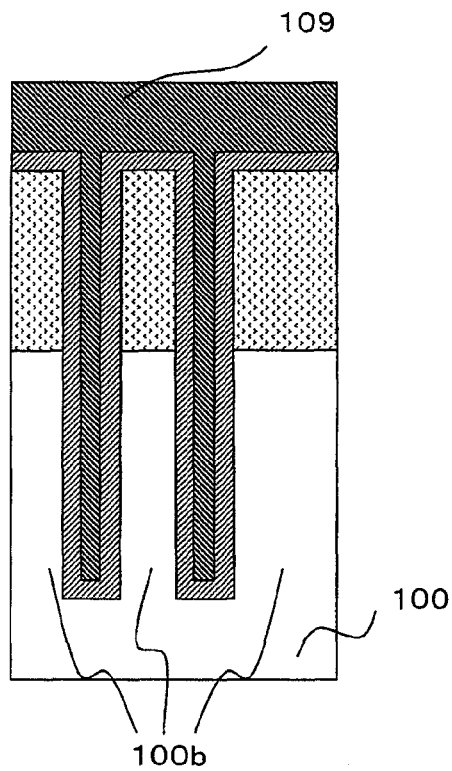
FIG. 37 is a cross-sectional view showing a production step subsequent to FIG. 36.

Next, as shown in FIG. 37, a buried film 109 of a silicon film is formed by a low-pressure CVD method so that the trenches formed by adjacent silicon pillars (semiconductor pillars) 100b are filled with the buried film 109.

Figure 38:
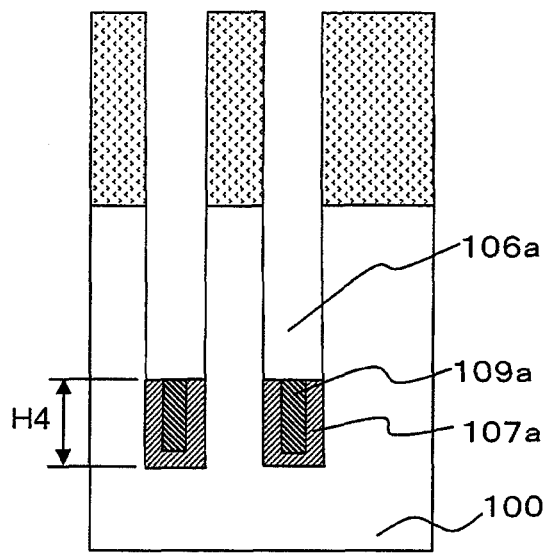
FIG. 38 is a cross-sectional view showing a production step subsequent to FIG. 37.

Then, as shown in FIG. 38, an etchback is performed with anisotropic dry etching that etches the buried film 109 and the insulator film 107 at the same rate, so that the height H4 from the bottoms of the trenches 106 to upper surfaces of those films is 50 nm. As a result, insulator films 107a that cover the bottoms of the trenches 106 and buried films 109a that have been buried in the insulator films 107a are formed. Accordingly, new trenches 106a are formed above upper surfaces of the insulator films 107a and the buried films 109a. At that time, the buried films 109a do not serve as bit lines.

Figure 39:
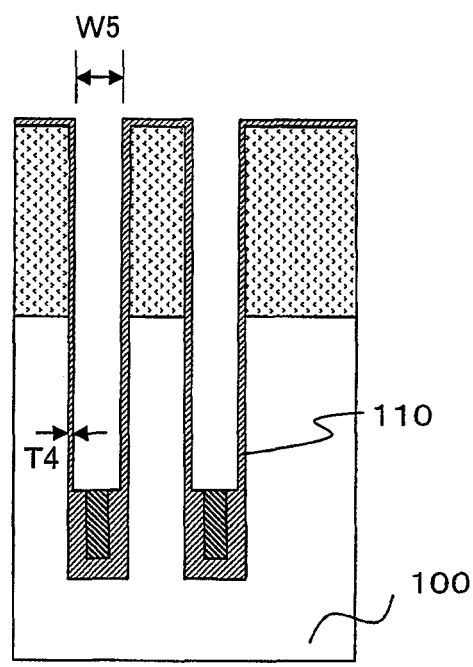
FIG. 39 is a cross-sectional view showing a production step subsequent to FIG. 38.

Thereafter, as shown in FIG. 39, an insulator film 110 of a silicon oxide film is formed with a film thickness T4 of 3 nm on sidewalls (inner walls) of the trenches 106a by a thermal oxidation method. As a result, the remaining trenches 106a maintain an opening width W5 of 39 nm.

Figure 40:
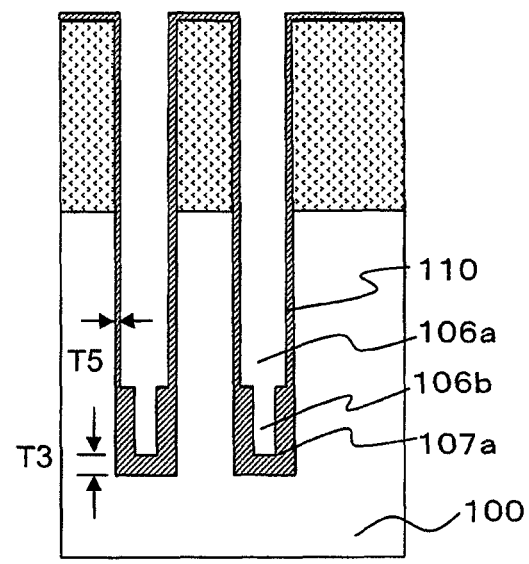
FIG. 40 is a cross-sectional view showing a production step subsequent to FIG. 39.

Subsequently, as shown in FIG. 40, the buried films 109a are selectively removed by wet etching with aqueous ammonia ($NH_3$). No silicon oxide film is etched by this wet etching process. Therefore, the insulator films 107a of a silicon oxide film remain in a state in which a film thickness T3 of 10 nm is maintained at the bottoms of the insulator films 107a. Furthermore, the insulator film 110 also remains in a state in which a film thickness T5 of 3 nm is maintained. Now new trenches 106b are formed at the bottoms of the trenches 106a by removal of the buried films 109a.

Figure 41:
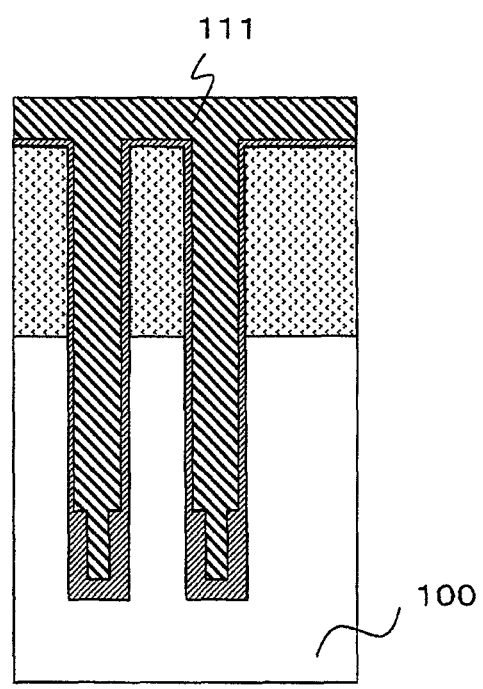
FIG. 41 is a cross-sectional view showing a production step subsequent to FIG. 40.

Next, as shown in FIG. 41, a buried film 111 of a silicon film is formed on the entire surface of the substrate so that the trenches 106a and 106b are filled with the buried film 111.

Figure 42:
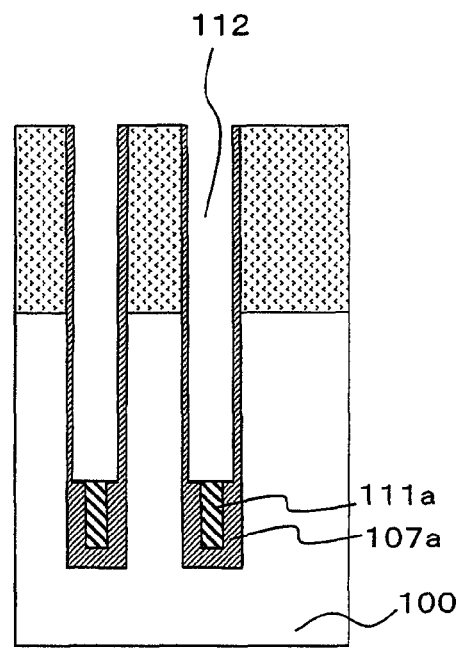
FIG. 42 is a cross-sectional view showing a production step subsequent to FIG. 41.

Then, as shown in FIG. 42, an etchback is performed on the buried film 111 with anisotropic dry etching, so that portions of the insulator film 110 corresponding to the trenches 106a are exposed. Thus, new buried films 111a of the buried film 111 are formed so as to have an upper surface located at the same height as the upper surfaces of the insulator films 107a. Furthermore, new trenches 112 are formed at that time. The trenches 112 maintain an opening width of 39 nm.

Figure 43:
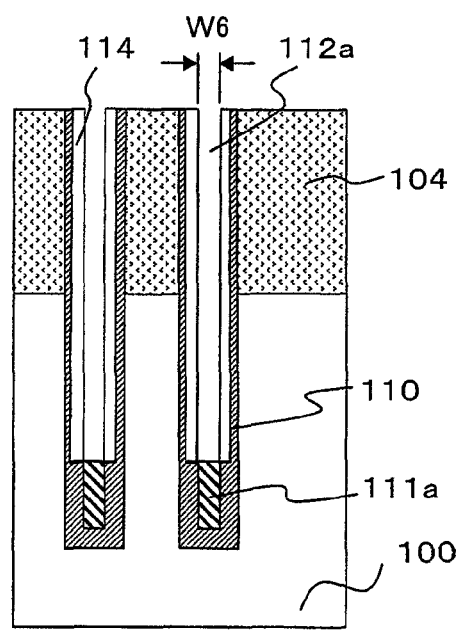
FIG. 43 is a cross-sectional view showing a production step subsequent to FIG. 42.

Thereafter, as shown in FIG. 43, a silicon nitride film is formed with a thickness of 5 nm on the entire surface including inner surfaces of the trenches 112 by a CVD method. Subsequently, an etchback is performed with anisotropic dry etching so as to form sidewall insulator films 114 of a silicon nitride film. In FIG. 43, regions denoted by the reference numeral 114 do not refer to a space or room but insulator films. The sidewall insulator films 114 formed on the mask film 104 and the sidewall insulator films 114 formed on the buried films 111a are removed. The sidewall insulator films 114 serve to prevent the insulator films 110 from being etched during a subsequent wet etching process. At that time, the trenches 112 are formed into new trenches 112a. The trenches 112a maintain an opening width W6 of 29 nm.

Figure 44:
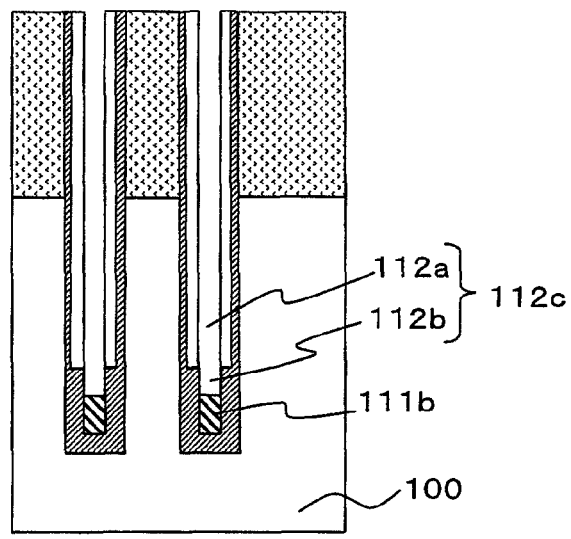
FIG. 44 is a cross-sectional view showing a production step subsequent to FIG. 43.

Next, as shown in FIG. 44, an etchback is performed on the buried films 111a having an exposed surface so as to dig the buried films 111a by 30 nm. Thus, the buried films 111a, which have had a thickness of 40 nm in a vertical direction at the time of its formation in FIG. 42, are formed into buried films 111b having a thickness of 10 nm. Furthermore, new trenches 112b are formed in regions being dug. The trenches 112b constitute trenches 112c along with the trenches 112a, which have been formed above the trenches 112b.

Figure 45:
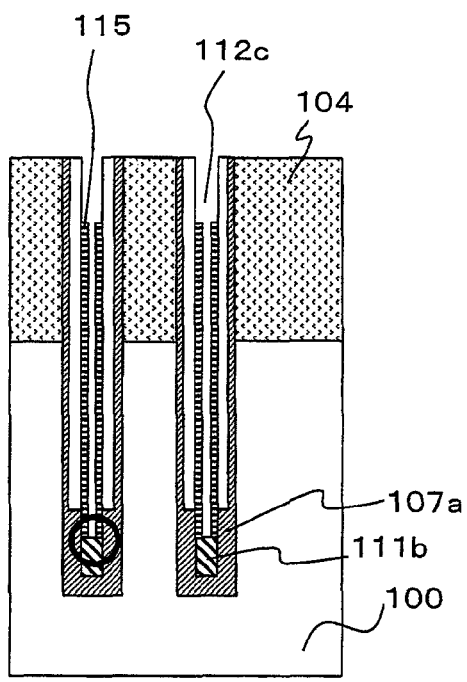
FIG. 45 is a cross-sectional view showing a production step subsequent to FIG. 44.

Then, as shown in FIG. 45, a titanium nitride film, which is to be an etching sacrificial layer, is formed with a thickness of 7 nm on the entire surface of the substrate by a CVD method. Thereafter, an etchback is performed with anisotropic dry etching so as to form sidewalls 115 on side surfaces of the trenches 112c. Thus, the insulator films 107a exposed on side surfaces of the trenches 112b are covered with the sidewalls 115. The sidewalls 115 are formed in a controlled state in which the titanium nitride film on the upper surfaces of the buried films 111b (portion indicated by the black circle in FIG. 45) is removed while the upper surfaces of the sidewalls 115 are located at a height 23 nm below the upper surface of the mask film 104.

Figure 46:
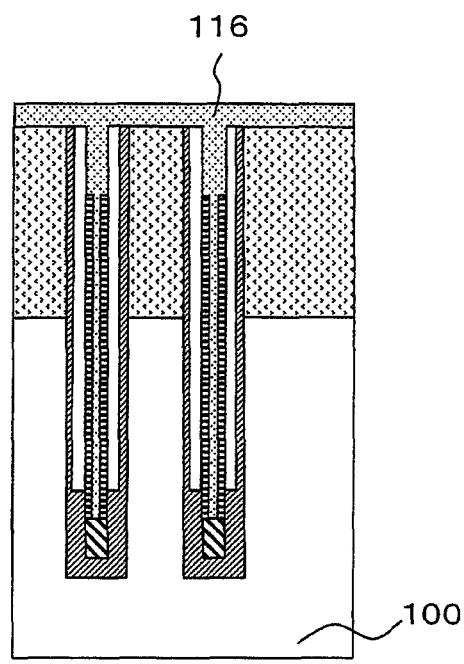
FIG. 46 is a cross-sectional view showing a production step subsequent to FIG. 45.

Subsequently, as shown in FIG. 46, an insulator film 116 of a silicon oxide film is formed so that spaces remaining in the trenches 112c (FIG. 45) are filled with the insulator film 116.

The insulator film 116 may be formed by a CVD method, an atomic layer deposition (ALD) method, or a spin coating method.

Figure 47:
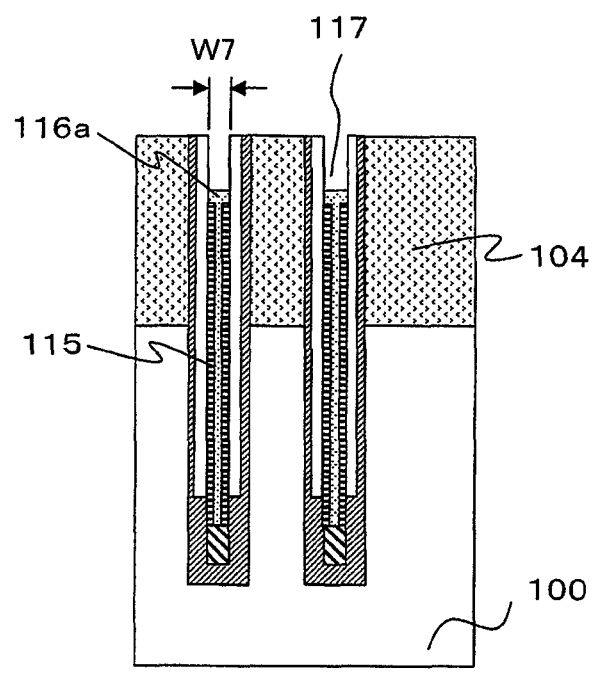
FIG. 47 is a cross-sectional view showing a production step subsequent to FIG. 46.

Next, as shown in FIG. 47, an etchback is performed on the insulator film 116 so as to form insulator films 116a covering the sidewalls 115 and form trenches 117 above the insulator films 116a. The insulator films 116a are formed in a controlled state in which upper surfaces of the insulator films 116a are located at a height 15 nm below the upper surface of the mask film 104 while upper surfaces of the sidewalls 115 of a titanium nitride are not exposed. In the second embodiment, a vertical interval between the upper surfaces of the sidewalls 115 of a titanium nitride and the upper surfaces of the insulator films 116a is 10 nm. Nevertheless, that interval may be in a range of 5 nm to 15 nm. The trenches 117 have an opening width W7 of 29 nm, which is the same as in the step shown in FIG. 43.

Figure 48:
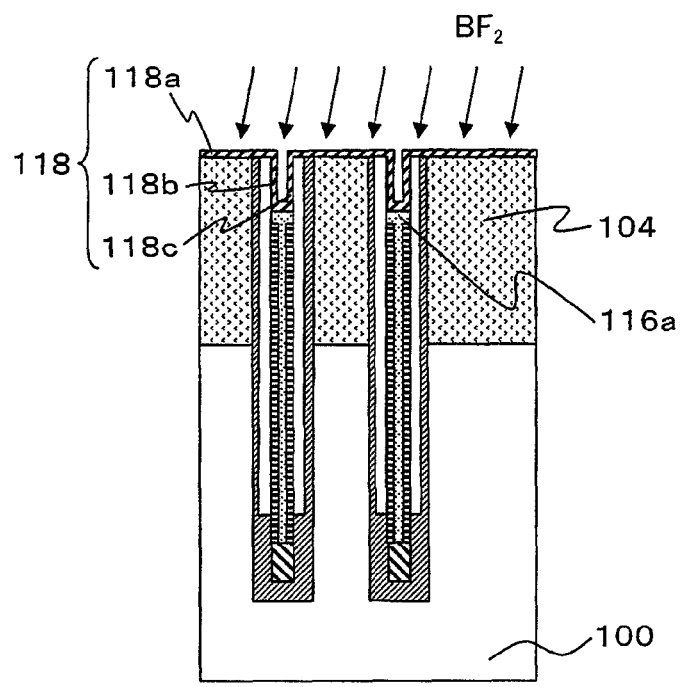
FIG. 48 is a cross-sectional view showing a production step subsequent to FIG. 47.

Then, as shown in FIG. 48, a protective film 118 of a silicon film is formed with a thickness of 5 nm on the entire surface including inner surfaces of the trenches 117 by a CVD method. The protective film 118 is preferably formed of an amorphous silicon film (polysilicon) exerting no influence due to crystal grains that would cause uneven etching in a subsequent etching process. After the formation of the protective film 118, boron fluoride ($BF_2$) is implanted by an oblique ion implantation method in order to dope impurities only into one of the protective films 118b and 118c formed on both side surfaces of the trenches 117. FIG. 48 shows an example of an oblique ion implantation method of doping impurities into the protective film 118b. Impurities are doped into a protective film 118 formed on a sidewall opposite to a pillar on which a bit line contact is to be formed, which will be described later.

Thus, impurities are doped into the protective film 118a formed on the mask film 104, the protective film 118b having a vertical surface formed on the side surfaces of the trenches 117, and part (left half) of the protective film 118 having a horizontal surface formed on the buried insulator film 116a. Since ions should be implanted in the horizontal surfaces and the vertical surfaces in this example, two-stage implantation with different angles may be used to achieve optimum ion implantation for respective portions to be subjected to implantation. In the present embodiment, the implantation angle is set in a range of 27° to 45°. The implantation angle refers to an inclination angle from a perpendicular line to the surface of the semiconductor substrate. Furthermore, when the aforementioned two-stage implantation is used in the second embodiment, the implantation angles are set to be 27° and 45°. Nevertheless, the implantation angles may be changed in consideration of the depth and width of the trenches 117 and the film thickness of the protective film 118.

Figure 49:
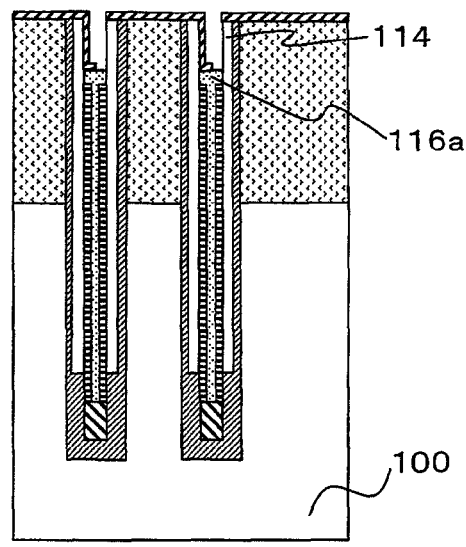
FIG. 49 is a cross-sectional view showing a production step subsequent to FIG. 48.

Next, as shown in FIG. 49, the protective films 118c in which no impurities have been implanted and the protective films 118 formed on right halves of the insulator films 116a are removed by wet etching with aqueous ammonia ($NH_3$). Thus, the sidewall insulator films 114 of a silicon nitride film and the right halves of the insulator films 116a are exposed.

Figure 50:
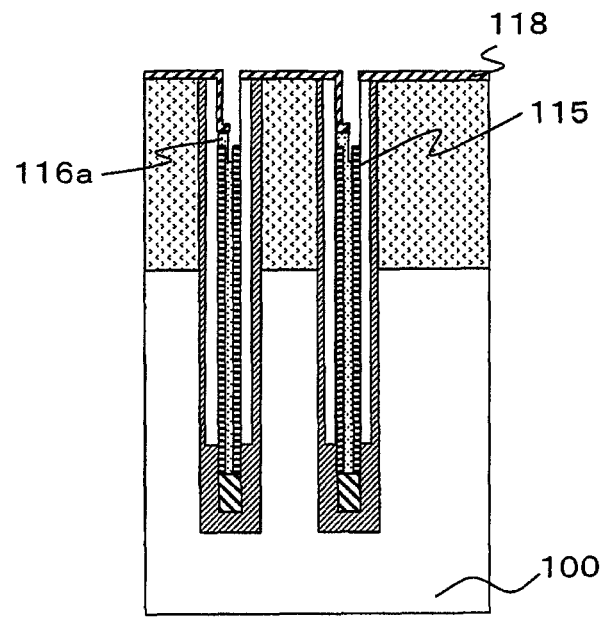
FIG. 50 is a cross-sectional view showing a production step subsequent to FIG. 49.

Then, as shown in FIG. 50, the right halves of the exposed insulator films 116a are removed by anisotropic dry etching while the protective film 118 is used as a mask. At that time, the leftward sidewalls 115 are covered with the insulator films 116a and the protective films 118 and are not exposed. Specifically, impurity doping regions of ion implantation should be controlled with the protective film 118 of FIG. 48 such that the leftward sidewalls 115 are not exposed during this anisotropic dry etching process. Therefore, the implantation angle is determined in consideration of the depth and width of the trenches 117 and the film thickness of the protective film 118.

Figure 51:
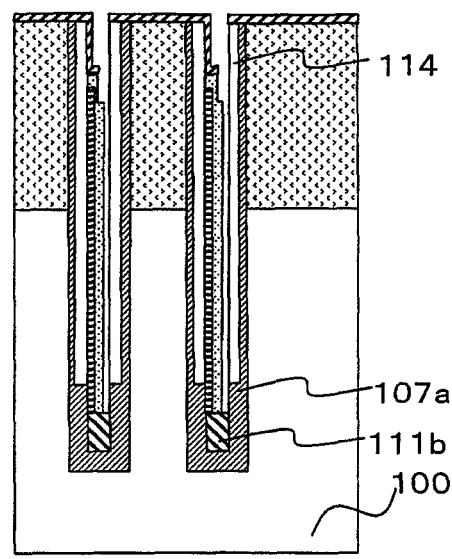
FIG. 51 is a cross-sectional view showing a production step subsequent to FIG. 50.

Thereafter, as shown in FIG. 51, the rightward sidewalls 115 of a titanium nitride, which have an exposed upper surface, are selectively removed by wet etching. A mixture liquid of ammonia and hydrogen peroxide or the like may be used as an etching liquid. Thus, the sidewall insulator films 114 of a silicon nitride film, part of the insulator films 107a formed within the trenches 106, and part of the upper surfaces of the buried films 111b are exposed.

Figure 52:
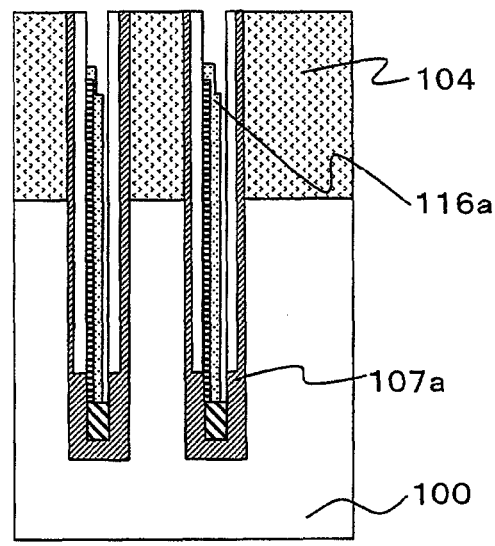
FIG. 52 is a cross-sectional view showing a production step subsequent to FIG. 51.

Subsequently, as shown in FIG. 52, an ion implantation is performed, the protective film 118 in which ions were implanted (FIG. 48) and remaining on a surface of the substrate (FIG. 50) is removed by isotropic dry etching. The mask film 104 and the upper surfaces of the insulator films 116a are exposed by this isotropic dry etching.

Figure 53:
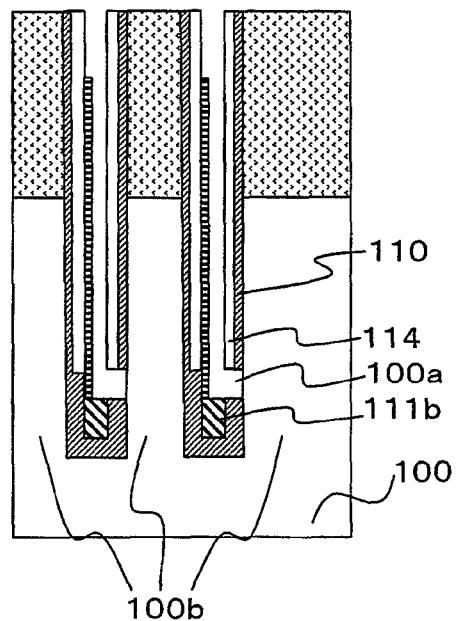
FIG. 53 is a cross-sectional view showing a production step subsequent to FIG. 52.

Next, as shown in FIG. 53, the insulator films 107a having an exposed side surface are etched with a hydrofluoric acid (HF) solution so as to form side openings 100a, which expose part of the silicon pillars (semiconductor pillars) 100b. The side openings 100a are formed between the bottoms of the sidewall insulator films 114 and the upper surfaces of the buried films 111b. At that time, the insulator films 116a are also removed. However, the insulator films 110 remain as they are protected by the sidewall insulator films 114 of a silicon nitride film and are not etched.

Figure 54:
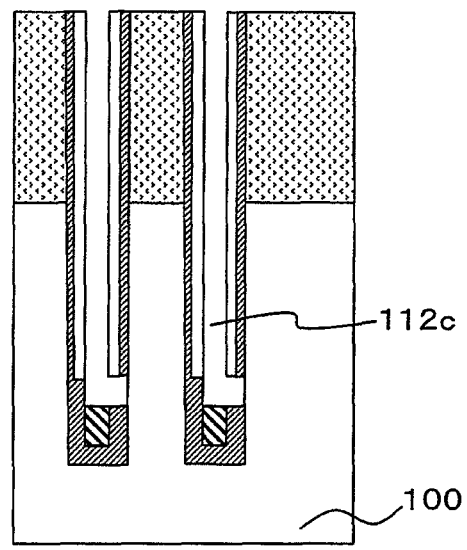
FIG. 54 is a cross-sectional view showing a production step subsequent to FIG. 53.

Then, as shown in FIG. 54, the sidewalls 115 of a titanium nitride exposed in the trenches (FIG. 50) are selectively removed by wet etching. Thus, the trenches 112c formed in the step of FIG. 44 are exposed.

Figure 55:
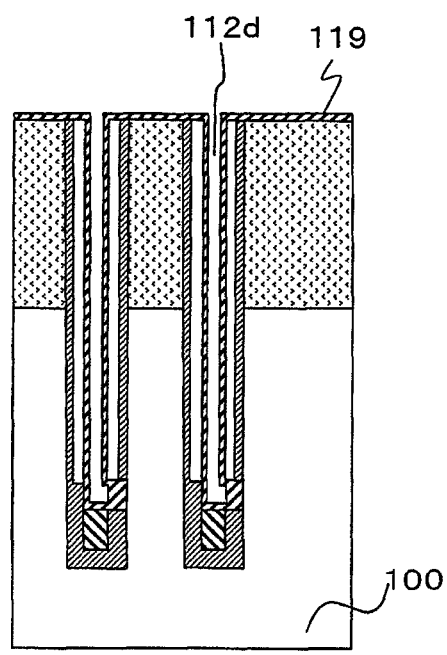
FIG. 55 is a cross-sectional view showing a production step subsequent to FIG. 54.

Thereafter, as shown in FIG. 55, a coating film 119, which is to be a first silicon film, is deposited with a thickness of 10 nm so that inner surfaces of the trenches 112c are covered with the coating film 119. For example, the following deposition conditions may be used. Monosilane ($SiH_4$) is used as a material gas. A flow rate of the gas is 1,500 sccm, and a heating temperature is 550° C. The heating temperature is not limited to 550° C. and may be in a range of 500° C. to 600° C. At that time, new trenches 112d are formed.

Figure 56:
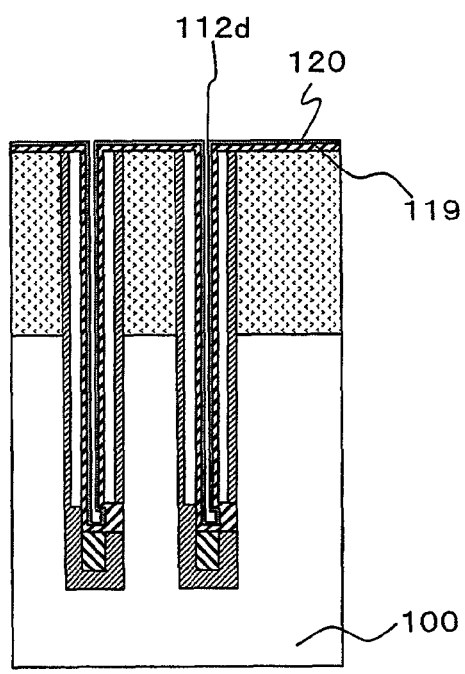
FIG. 56 is a cross-sectional view showing a production step subsequent to FIG. 55.

Subsequently, as shown in FIG. 56, an impurity layer 120, which is to be a second silicon film, is formed on the coating film 119 by adsorbing impurities of arsenic (As) on the exposed coating film 119 so that the concentration of the impurities is $1.0 \times 10^{15}$ atoms/$cm^3$. For example, the following adsorption conditions may be used. Arsine ($AsH_3$) is used as a material gas. A flow rate of the gas is 400 sccm, and a heating temperature is 550° C. The heating temperature is not limited to 550° C. and may be in a range of 500° C. to 600° C. Within this temperature range, arsine is decomposed to produce a sufficient amount of arsenic. Thus, arsenic can readily be adsorbed on the coating film 119. At that time, the trenches 112d remain.

Figure 57:
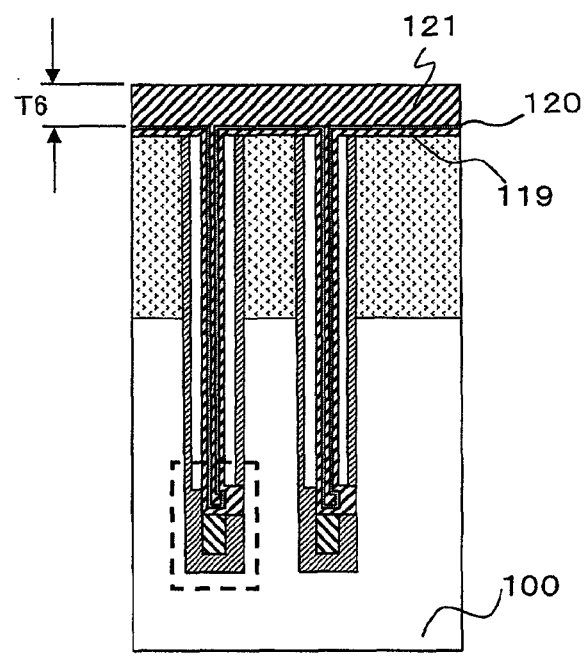
FIG. 57 is a cross-sectional view showing a production step subsequent to FIG. 56.
Figure 58:
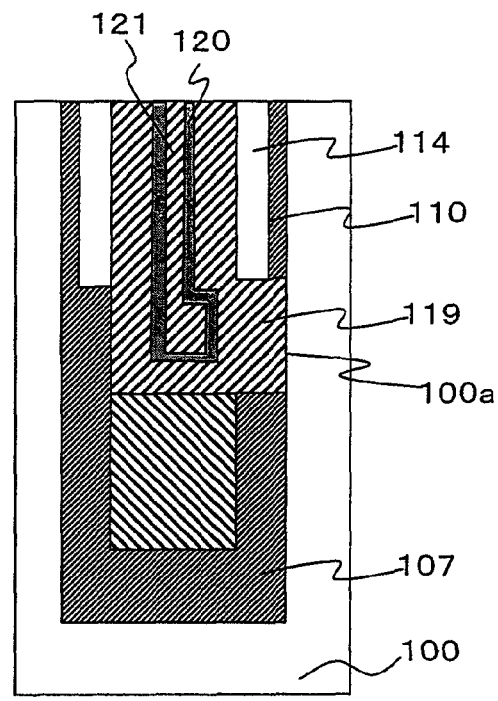
FIG. 58 is a cross-sectional view showing a production step subsequent to FIG. 57.

Next, as shown in FIG. 57, a buried film 121, which is to be a third silicon film, is deposited on the impurity layer 120 by a CVD method so that the trenches 112d are filled with the buried film 121. The thickness T6 of the buried film 121 from a surface of the coating film 119 is 130 nm. For example, the following deposition conditions may be used. Monosilane ($SiH_4$) is used as a material gas. A flow rate of the gas is 1,500 sccm, and a heating temperature is 550° C. The heating temperature is not limited to 550° C. and may be in a range of 500° C. to 600° C. As shown in FIG. 58, which is an enlarged view of a portion surrounded by broken lines in FIG. 57, the interior of the side opening 100a surrounded by the insulator film 107, the insulator film 110, and the sidewall insulator film 114 is uniformly filled with the coating film 119.

Figure 59:
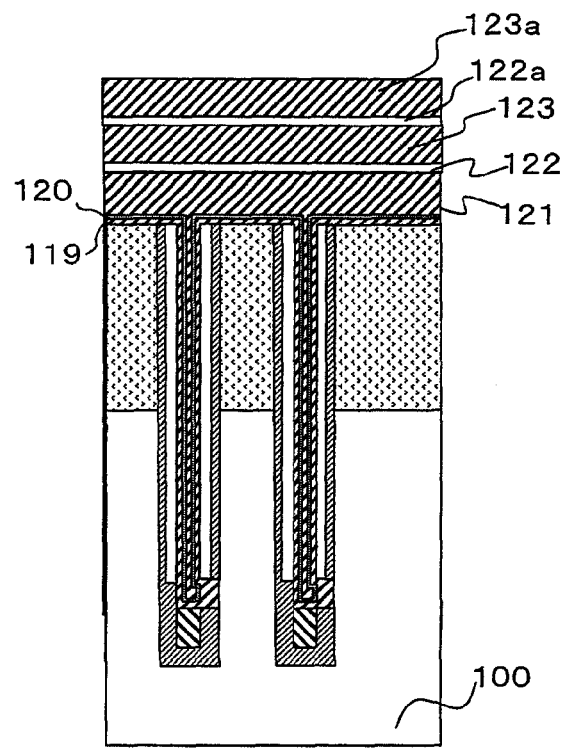
FIG. 59 is a cross-sectional view showing a production step subsequent to FIG. 58.

Then, as shown in FIG. 59, an insulator film 122 of a silicon oxide film, which is to be a first diffusion barrier film, is deposited with a thickness of 3 nm on the buried film 121 by a thermal oxidation method. For example, the following deposition conditions may be used. Oxygen ($O_2$) is used as a material gas. A flow rate of the gas is 3 SLM, and a heating temperature is 550° C. The heating temperature is not limited to 550° C. and may be in a range of 500° C. to 600° C. Furthermore, the film thickness of the insulator film 122 is not limited to 3 nm and may be in a range of 2 nm to 3 nm. Thereafter, a coating film 123, which is to be a fourth silicon film, is deposited with a thickness of 35 nm on the insulator film 122 by a CVD method. For example, the following deposition conditions may be used. Monosilane ($SiH_4$) is used as a material gas. A flow rate of the gas is 1,500 sccm, and a heating temperature is 550° C. The heating temperature is not limited to 550° C. and may be in a range of 500° C. to 600° C. Subsequently, an insulator film 122a of a silicon oxide film, which is to be a second diffusion barrier film, is deposited with a thickness of 3 nm on the coating film 123 by a thermal oxidation method. For example, the same deposition conditions as for the insulator film 122 may be used. In FIG. 59, the reference numerals 122 and 122a do not indicate any space or room but indicate insulator films. Furthermore, a coating film 123a, which is to be a fifth silicon film, is deposited with a thickness of 35 nm on the insulator film 122a by a CVD method. For example, the same deposition conditions as for the coating film 123 may be used.

Thus, insulator films of a silicon oxide film as a diffusion barrier film and coating films of a silicon film such as a polysilicon film are alternately deposited to produce a multilayered film. In this case, effects of preventing outer diffusion are improved as compared to a case of a single-layer polysilicon film having the same film thickness as the multilayered film. Therefore, the thickness of the multilayered film can be reduced. Accordingly, a throughput of deposition processes can be improved. The number of stacks of the multilayered film is not limited to two and may be designed in any way depending upon the permissible amount of outer diffusion. The coating film of a polysilicon film located at the uppermost layer of the multilayered film may be eliminated depending upon the permissible amount of outer diffusion.

Separate production devices may be used in the production processes illustrated in FIGS. 55 to 59. Nevertheless, it is preferable to perform the production processes while a single production device changes processing recipes. With use of a single production device, it is not necessary to transport the silicon substrate 100 (silicon wafer) from one production device to another. Therefore, a throughput can be improved.

Figure 60:
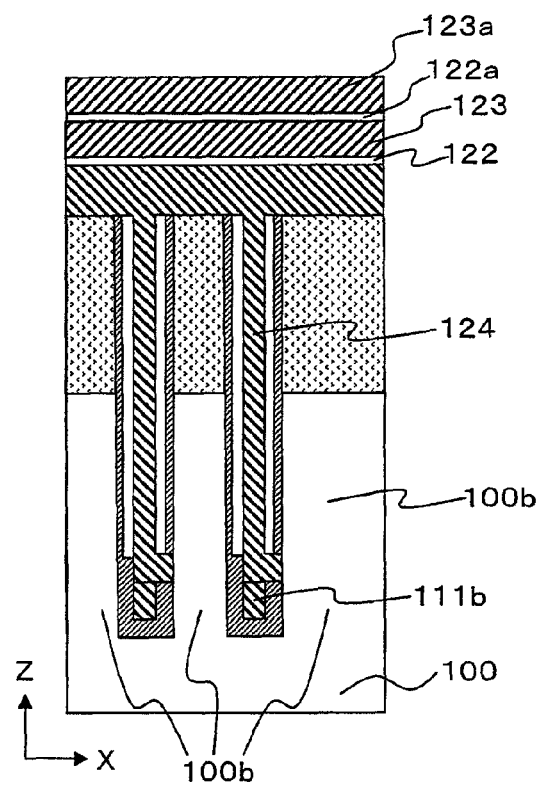
FIG. 60 is a cross-sectional view showing a production step subsequent to FIG. 59.

Next, as shown in FIG. 60, the impurities in the impurity layer 120 (FIG. 59) are thermally diffused into the coating film 119 (FIG. 59) and the buried film 121 (FIG. 59) by a lamp annealing method. At that time, annealing may be conducted under a nitrogen ($N_2$) atmosphere at a heating temperature of 1,000° C. The heating temperature is not limited to 1,000° C. and may be in a range of 800° C. to 1,200° C. As a result of this annealing process, the impurities in the impurity layer 120 are present in the coating film 119 and the buried film 121 with a uniform concentration gradient. Those films are incorporated into a doped layer 124. However, since the coating film 119 and the buried film 121 have quite different film thicknesses, they have different impurity concentrations on surfaces opposite to surfaces facing the impurity layer 120 due to a difference of diffusion lengths. More specifically, the arsenic concentration at a contacting surface with the silicon pillars 100b is $1.0 \times 10^{18}$ atoms/$cm^3$, whereas the arsenic concentration at a contacting surface with the insulator film 122 is $1.0 \times 10^{10}$ atoms/$cm^3$.

Figure 61:
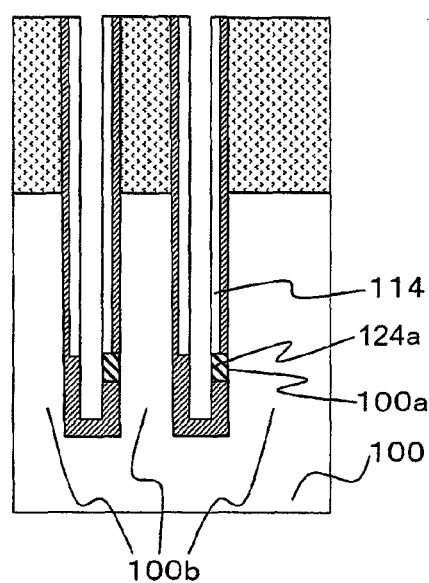
FIG. 61 is a cross-sectional view showing a production step subsequent to FIG. 60.

Then, as shown in FIGS. 60 and 61, an etchback is performed on the coating film 123, the insulator film 122, the doped layer 124, and the buried film 111b with anisotropic dry etching. In each of the side openings 100a, the doped layer 124 remains because the sidewall insulator film 114 serves as a mask. Thus, contacts 124a to the silicon pillars (semiconductor pillars) 100b are formed.

Figure 62:
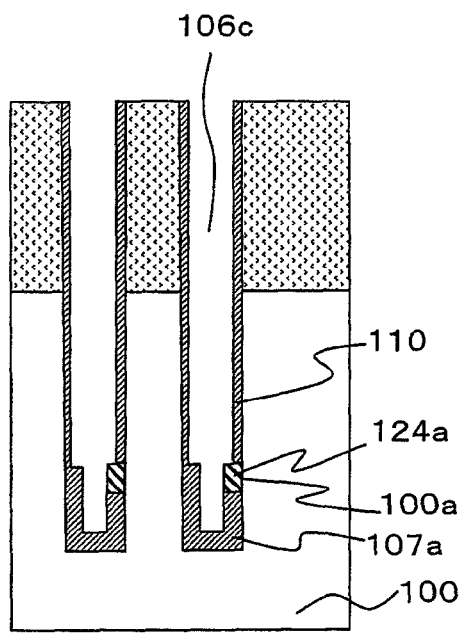
FIG. 62 is a cross-sectional view showing a production step subsequent to FIG. 61.

Thereafter, as shown in FIG. 62, the sidewall insulator films 114 (FIG. 61) of a silicon nitride film is selectively removed by wet etching, so that the insulator films 110 are exposed. In the side openings 100a, a portion of the insulator film 107a forming the trenches 106b in the step of FIG. 40 has been replaced with the contacts 124a. At that time, new trenches 106c, which serve as first grooves, are formed.

Figure 63:
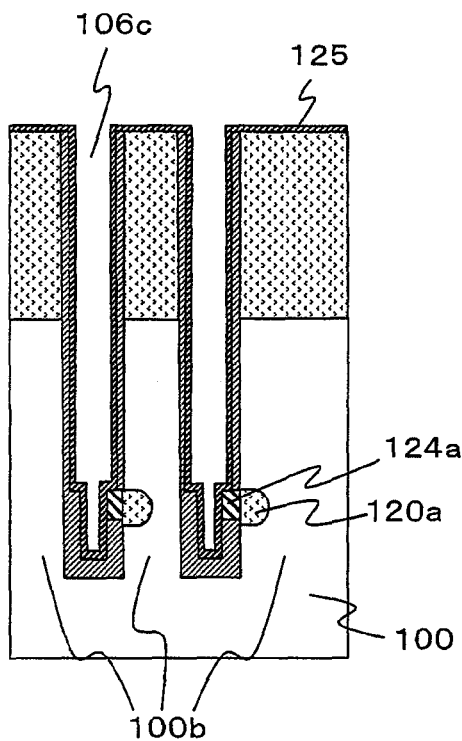
FIG. 63 is a cross-sectional view showing a production step subsequent to FIG. 62.

Subsequently, as shown in FIG. 63, a barrier film 125 of a titanium nitride is formed with a thickness of 4 nm on the overall surface including inner surfaces of the trench 106c, which serve as first grooves. Prior to the formation of the barrier film 125, a titanium film is formed with a thickness of 1 nm on a surface of the silicon substrate 100 in the same reaction chamber for CVD. Because this titanium film deposits on surfaces of the contacts 124a formed of an arsenic-doped silicon film and forms a titanium silicide having a low resistance, the titanium film can reduce the resistance of the contacts. Titanium formed on the insulator films other than the silicon substrate 100 is nitrided at the time of the formation of a titanium nitride. Thus, titanium is formed into titanium nitride. Arsenic is diffused into the silicon substrate (semiconductor substrate) 100 from the contacts 124a by a thermal treatment of 650° C. for forming the barrier film 125. Thus, a diffusion layer 120a is formed at one of side surfaces of each of the silicon pillars (semiconductor pillars) 100b. The diffusion layers 120a may be formed continuously after the formation of the doped layers 124 in the step of FIG. 60.

Figure 64:
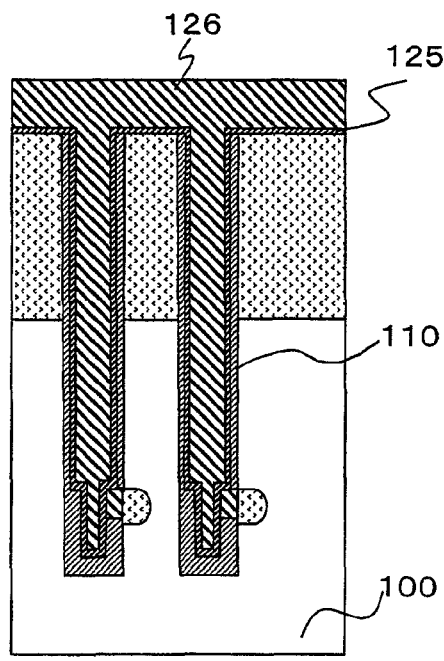
FIG. 64 is a cross-sectional view showing a production step subsequent to FIG. 63.

Next, as shown in FIG. 64, a conductive film 126 of tungsten is formed on the entire surface of the barrier film 125 by a CVD method so that the trenches 106c as first grooves are filled with the conductive film.

Figure 65:
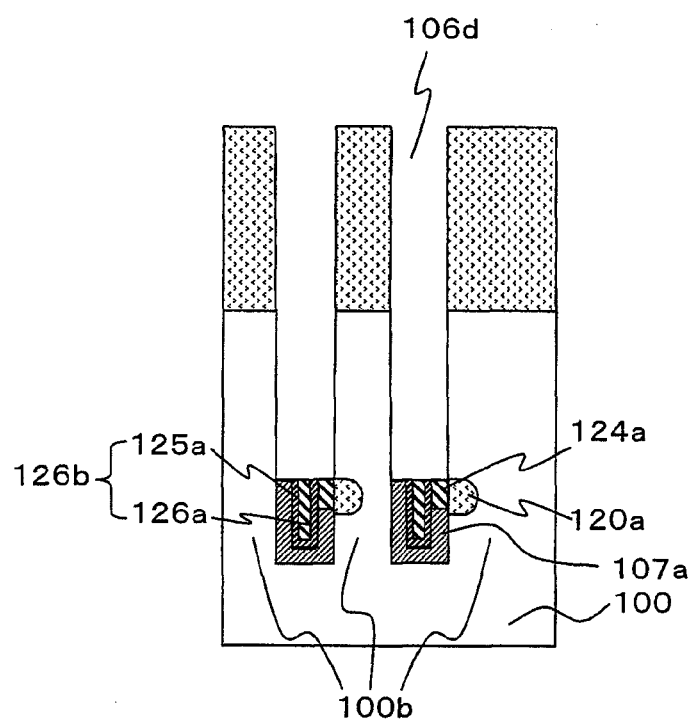
FIG. 65 is a cross-sectional view showing a production step subsequent to FIG. 64.

Then, as shown in FIG. 65 together with FIG. 64, an etchback is performed on the conductive film 126 and the barrier film 125 with anisotropic dry etching until surfaces of the conductive film 126 and the barrier film 125 are located at the same height as upper surfaces of the insulator films 107a. Thus, a bit line 126b including the barrier film 125a and the conductive film 126a, which are surrounded by the insulator film 107a, is formed in each of the trenches 106c formed as the first grooves by the silicon pillars (semiconductor pillars) 100b. The bit line 126b is connected to the diffusion layer 120a via a titanium silicide (not shown) and the contact 124a at a side surface of the bit line 126b. Furthermore, a new trench 106d is formed above the bit line 126b by an etchback. Thereafter, the insulator film 110 (FIG. 64) is removed by wet etching, so that part of the side surfaces of the silicon pillars (semiconductor pillars) 100b is exposed.

Figure 66:
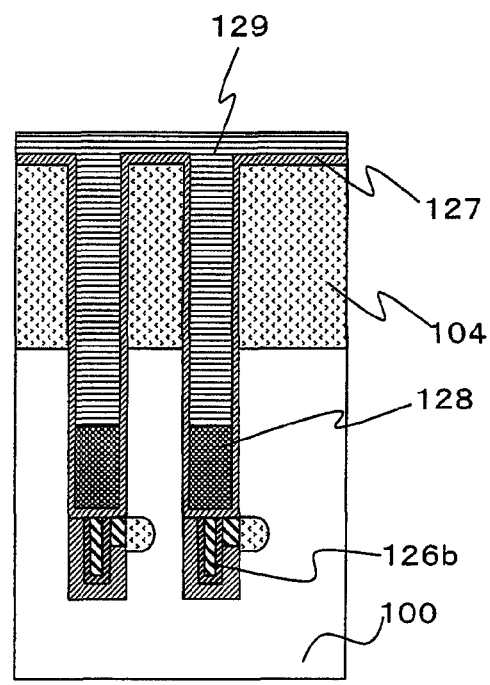
FIG. 66 is a cross-sectional view showing a production step subsequent to FIG. 65.
Figure 67:
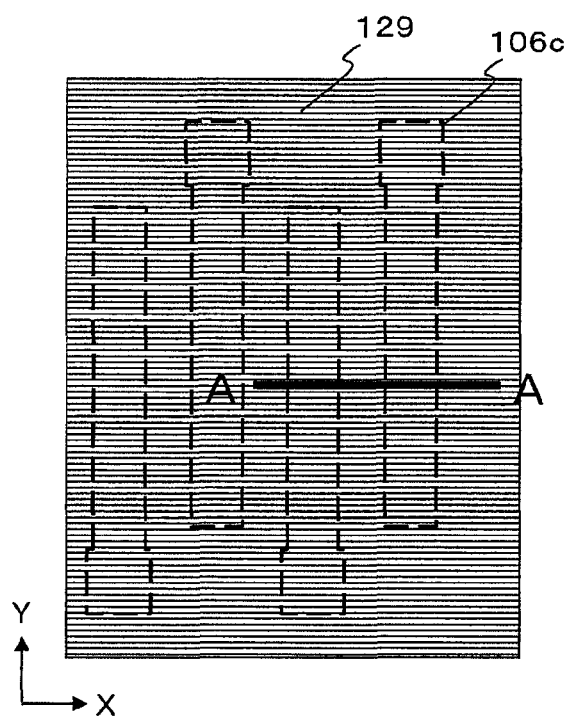
FIG. 67 is a plan view showing a portion including a portion illustrated in FIG. 66.

Subsequently, as shown in FIG. 66, an insulator film 127 of a silicon nitride film is formed with a thickness of 10 nm on the entire surface including inner surfaces of the trenches 106d by a CVD method. Furthermore, the trenches 106d are filled with a silicon oxide film by a spin coating method. Next, an etchback is performed so as to form insulator films 128 of a silicon oxide film having a thickness of 70 nm. Accordingly, shallowed trenches remain above the insulator films 128. Then an insulator film 129 of a silicon oxide film is formed by a CVD method so that the shallowed trenches are filled with the insulator film 129. The plan view at that time is as shown in FIG. 67. Thus, as with FIG. 33, a plurality of trenches 106c in which the bit lines 126b (FIG. 66) are buried extend along the Y-direction in parallel to each other.

The buried bit lines are completed with the above processes. Then buried word lines are produced. Those buried word lines are produced in the same manner as described with reference to FIGS. 21 to 30. Therefore, the explanation of the method of producing buried word lines is omitted herein.

In the second embodiment, the diffusion layers 120a are formed in the silicon pillars 100b by thermally diffusing impurities from the side openings 100a, which expose part of the silicon pillars 100b. At that time, the side openings 100a are formed right below the channel regions. Therefore, the diffusion layers 120a, which serve as one of a source and a drain (S/D), can readily be formed right below the channel regions.

According to the present invention, instead of ion implantation, a silicon film such as polysilicon in which impurities have been doped is formed near a semiconductor pillar in which a diffusion layer is provided. The impurities are diffused to the semiconductor pillar by a thermal diffusion method. In a semiconductor pillar of a vertical transistor, a diffusion layer is formed on one of side surfaces of the semiconductor pillar, and another diffusion layer or a bit line is provided on the other side surface of the semiconductor pillar. Therefore, the diffusion layer needs to be formed only on one of the side surfaces of the semiconductor pillar and does not need to reach the opposite side surface of the semiconductor pillar by thermal diffusion. In view of such structural limitations, arsenic (As) having a small diffusion coefficient is used as impurities. Since arsenic is a highly toxic substance, outer diffusion from a semiconductor substrate (wafer) into atmosphere needs to be minimized to avoid adverse influence on humans. Particularly, since a vertical transistor inevitably requires thermal diffusion of arsenic into a silicon pillar, outer diffusion caused by thermal diffusion should be prevented.

According to the present invention, a diffusion barrier film is formed on a silicon film such as polysilicon including impurities. A multilayer film in which an insulator film of a silicon oxide film as a diffusion barrier film and a coating film of a silicon film such as polysilicon are alternately deposited is provided. Therefore, prevention of outer diffusion can be improved as compared to a single-layer polysilicon film having the same film thickness as the multilayer film. As a result, a safe manufacturing environment can be ensured.

Furthermore, in a case where the prevention effects are constant, the multilayer film can be reduced in thickness as compared to a single-layer polysilicon film. Therefore, a throughput of a deposition process can be improved. The number of stacks of the multilayered film is not limited to two and may be designed in any way depending upon the permissible amount of outer diffusion. The coating film of a silicon film located at the uppermost layer of the multilayered film may be eliminated depending upon the permissible amount of outer diffusion. Separate production devices may be used in the production processes illustrated in FIGS. 7 to 12 and 55 to 59. Nevertheless, it is preferable to perform the production processes while a single production device changes processing recipes. With use of a single production device, it is not necessary to transport the silicon substrate 100 (silicon wafer) from one production device to another. Therefore, a throughput can be improved.

According to the embodiments of the present invention, a side surface of a groove on which a semiconductor pillar is exposed is covered with an insulator film. Then a polysilicon film including impurities is formed within the entire space of the groove. The impurities are thermally diffused into the semiconductor pillar at a bottom of the groove. Thus, a diffusion layer to be a bit line can be formed only right below a channel region. Accordingly, malfunction of a transistor that has been caused by unnecessary ion implantation can be eliminated.

While the present invention has been described with reference to several embodiments thereof, the present invention is not limited to those embodiments. As a matter of course, many modifications may be made therein without departing from the spirit and scope of the present invention.

What is claimed is:

1. A method of manufacturing a semiconductor device, the method comprising:
   forming a first silicon film over a semiconductor substrate;
   forming a second silicon film on the first silicon film;
   forming a third silicon film on the second silicon film;
   forming a first diffusion barrier film on the third silicon film; and
   performing a thermal treatment to diffuse an impurity included in the second silicon film into at least the first silicon film and the semiconductor substrate, respectively.

2. The method as recited in claim 1, wherein each of the first silicon film, the second silicon film, and the third silicon film is deposited in one of an amorphous state and a polycrystalline state.

3. The method as recited in claim 2, wherein the impurity comprises arsenic.

4. The method as recited in claim 1, wherein the first silicon film and the second silicon film are formed by selective epitaxial growth.

5. The method as recited in claim 4, wherein the impurity comprises arsenic.

6. A method of manufacturing a semiconductor device, the method comprising:
   forming a plurality of semiconductor pillars protruding vertical to a surface of a semiconductor substrate;
   forming an insulator film that covers side surfaces of grooves sandwiched between the plurality of semiconductor pillars;
   forming a first silicon film that covers inner surfaces of the grooves;
   forming, on the first silicon film, a second silicon film including an impurity that is diffused to the semiconductor substrate;
   forming a third silicon film on the second silicon film;
   forming, on the third silicon film, a first diffusion barrier film for preventing outer diffusion of the impurity; and
   forming diffusion layers by thermally diffusing the impurity from the second silicon film into the semiconductor pillars at regions of bottoms of the grooves.

7. The method as recited in claim 6, wherein the diffusion layer is formed as a buried bit line below a channel region in a direction of which the grooves extend.

8. The method as recited in claim 6, further comprising forming a doped layer by diffusing the impurity into the first silicon film and into the third silicon film after the forming of the first diffusion barrier film,
   wherein the forming the diffusion layer comprises thermally diffusing the impurity from the doped layer into the semiconductor pillars at regions corresponding to the bottoms of the grooves.

9. The method as recited in claim 8, wherein the first silicon film is formed so that the grooves are filled with the first silicon film.

10. The method as recited in claim 8, wherein the first diffusion barrier film is formed so that the grooves are filled with the first diffusion barrier film.

11. The method as recited in claim 8, wherein the third silicon film is formed in thickness thicker than the first silicon film.

12. The method as recited in claim 8, further comprising forming a fourth silicon film on the first diffusion barrier film.

13. The method as recited in claim 12, further comprising forming a second diffusion barrier film on the fourth silicon film.

14. The method as recited in claim 13, further comprising forming a fifth silicon film on the second diffusion barrier film.

15. The method as recited in claim 8, wherein the second silicon film including the impurity is formed by adsorbing the impurity on the first silicon film.

16. The method as recited in claim 8, wherein the impurity comprises arsenic.

17. A method of manufacturing a semiconductor device, the method comprising:
   forming first and second semiconductor fences protruding to a surface of a semiconductor substrate;
   forming an insulator film that covers a side surface of a groove sandwiched between the first and second semiconductor fences;
   forming a first silicon film that covers an inner surface of the groove;
   forming a second silicon film including an impurity on the first silicon film;
   forming a third silicon film on the second silicon film;
   forming, on the third silicon film, a first diffusion barrier film for preventing outer diffusion of the impurity; and
   forming a diffusion layer by thermally diffusing the impurity from the second silicon film into the first and second semiconductor fences at a bottom part of the groove.

18. The method as recited in claim 17, further comprising:
   removing the first diffusion barrier film, the third silicon film, the second silicon film and the first silicon film;
   etching the diffusion layer at the bottom part of the groove so that the diffusion layer in the first and second semiconductor fences are left thereafter;
   etching the semiconductor substrate at the bottom of the groove;
   forming an insulator to fill the groove; and
   forming a plurality of semiconductor pillars by dividing the first and second semiconductor fences, wherein the first and second semiconductor fences are divided by etching using a line pattern mask crossing the first and second semiconductor fences.

* * * * *